(12) United States Patent
Fushie et al.

(10) Patent No.: US 7,993,509 B2
(45) Date of Patent: Aug. 9, 2011

(54) MANUFACTURING METHOD OF DOUBLE-SIDED WIRING GLASS SUBSTRATE

(75) Inventors: Takashi Fushie, Tokyo (JP); Norimichi Annaka, Yamanashi (JP); Takeshi Kagatsume, Tokyo (JP)

(73) Assignee: Hoya Corporation, Tokyo (JP)

( * ) Notice: Subject to any disclaimer, the term of this patent is extended or adjusted under 35 U.S.C. 154(b) by 886 days.

(21) Appl. No.: 11/370,241

(22) Filed: Mar. 8, 2006

(65) Prior Publication Data

US 2006/0201818 A1 Sep. 14, 2006

Related U.S. Application Data

(63) Continuation of application No. PCT/JP2004/012720, filed on Sep. 2, 2004.

(30) Foreign Application Priority Data

Sep. 9, 2003 (JP) ................................. 2003-316133

(51) Int. Cl.
*C25D 5/02* (2006.01)
(52) U.S. Cl. ........................................ 205/125
(58) Field of Classification Search .................. 205/118, 205/125, 126, 162, 163, 183, 187; 438/687; 174/262

See application file for complete search history.

(56) References Cited

U.S. PATENT DOCUMENTS

| | | | |
|---|---|---|---|
| 3,646,572 A * | 2/1972 | Burr | 174/251 |
| 5,262,041 A | 11/1993 | Gulla | |
| 5,911,863 A | 6/1999 | Vetter et al. | |
| 6,199,273 B1 * | 3/2001 | Kubo et al. | 29/843 |
| 6,339,197 B1 * | 1/2002 | Fushie et al. | 174/262 |
| 6,852,627 B2 * | 2/2005 | Sinha et al. | 438/687 |
| 2002/0004301 A1 | 1/2002 | Chen et al. | |
| 2002/0066672 A1 * | 6/2002 | Iijima et al. | 205/125 |
| 2002/0170173 A1 | 11/2002 | Mashino | |
| 2002/0192939 A1 | 12/2002 | Sugihara | |
| 2006/0201201 A1 | 9/2006 | Fushie et al. | |

FOREIGN PATENT DOCUMENTS

| | | |
|---|---|---|
| DE | 42 01 612 A1 | 7/1993 |
| JP | 63-128699 | 6/1988 |

(Continued)

OTHER PUBLICATIONS

International Search Report of International Application PCT/JP2004/012720 mailed Nov. 16, 2004.
Supplementary European Search Report dated Apr. 20, 2009, issued in corresponding European Patent Application No. 04772674.0-1232.
Supplementary European Search Report dated Apr. 20, 2009, issued in corresponding European Patent Application No. 04772673.2-1232.

*Primary Examiner* — Luan V Van
(74) *Attorney, Agent, or Firm* — Westerman, Hattori, Daniels & Adrian, LLP

(57) ABSTRACT

To improve thermal resistance of a double-sided wiring glass substrate. A through-hole is filled with a copper film layer composed of metallic copper for electrically connecting the front and rear surfaces of the double-sided wiring glass substrate. The copper film layer is formed by first forming an electroless plating copper layer and then forming an electrolytic plating copper layer on a sidewall of the through-hole. As a result, the front and rear surfaces of the double-sided wiring glass substrate can be surely electrically connected as well as high thermal resistance of the whole double-sided wiring glass substrate can be secured.

6 Claims, 20 Drawing Sheets

FOREIGN PATENT DOCUMENTS

| JP | 03203341 A | 9/1991 |
| JP | 6-275954 | 9/1994 |
| JP | 11-177200 | 7/1999 |
| JP | 11177200 A * | 7/1999 |
| JP | 2000-077568 | 3/2000 |
| JP | 2000-77809 | 3/2000 |
| JP | 2000077809 A * | 3/2000 |
| JP | 2000-133945 | 5/2000 |
| JP | 2001-44639 | 2/2001 |
| JP | 2003-060330 | 2/2003 |

* cited by examiner

MANUFACTURING METHOD OF DOUBLE-SIDED WIRING GLASS SUBSTRATE

This application is a continuing application, filed under 35 U.S.C. §111(a), of International Application PCT/JP2004/012720, filed Sep. 2, 2004, it being further noted that priority is based upon Japanese Patent Application No. 2003-316133, filed Sep. 9, 2003.

BACKGROUND OF THE INVENTION

1. Field of the Invention

The present invention relates to a method for manufacturing a double-sided wiring glass substrate. Particularly, the present invention relates to a method for manufacturing a double-sided wiring glass substrate having on the front and rear surfaces thereof wirings and capable of mounting thereon various electronic parts.

2. Description of the Related Art

In recent years, there has been rapidly developed a MEMS (Micro Electro Mechanical System) in which function elements such as a sensor or a switch are constituted on a chip using an IC manufacturing technology, and as a result, dramatic miniaturization and high performance of electronic parts are being realized. In keeping with this trend, there is desired a wiring substrate capable of densely mounting with high reliability at low cost various conventional electronic parts and other electronic parts (hereinafter, referred to as "electronic parts") using the MEMS.

Conventionally, there is known a wiring substrate using as a core substrate material thereof a ceramic substrate, a glass epoxy substrate or a glass substrate. Particularly, in the case of the glass substrate, many photosensitive glass substrates capable of forming a hole or a groove using a photolithographic method are used. An example of the wiring substrate using the photosensitive glass substrate includes a multilayer wiring substrate (see, Japanese Unexamined Patent Application Publication No. Sho 63-128699 (p4, column 2, lines 6 to 19)). The multilayer wiring substrate is formed as follows. That is, a through-hole or wiring groove formed in the photosensitive glass substrate using the photolithographic method is filled with conductive paste by a screen printing method to form a wiring substrate. In the same manner, a plurality of the wiring substrates are formed. Then, the wiring substrates are laminated and calcined. Another example of the wiring substrate using the photosensitive glass substrate includes a build-up multilayer wiring substrate (see, Japanese Unexamined Patent Application Publication No. 2001-44639 (paragraph numbers [0030] to [0084], and FIGS. 1 to 6)). The build-up multilayer wiring substrate is formed as follows. That is, a conductive film is formed on a through-hole inner wall and a wiring using a plating method. Then, a resin insulating material is formed in the through-hole inside and between the wirings after the conductive film formation.

The wiring substrate for mounting electronic parts is required to have the following conditions. First, since a calcination temperature of an inorganic jointing paste commonly used in jointing electronic parts and a wiring substrate may be as extremely high as 400° C. or more, the substrate must have high thermal resistance. Secondly, the wirings must be densely formed for mounting many small electronic parts, particularly, many ultrasmall ones using the MEMS. Thirdly, the wirings must be formed on the substrate front and rear surfaces for improvement in mounting density.

In a wiring substrate using a photosensitive glass substrate, when using as a core substrate of the wiring substrate a glass substrate having high thermal resistance, a problem in thermal resistance as the wiring substrate can be avoided. However, in the case of filling of a through-hole with conductive paste or formation of wirings by a screen printing method, there may arise a problem that a void is generated in a conductive part formed within the through-hole or minute wirings are unable to be densely formed. Therefore, there are many cases of using a glass substrate having high thermal resistance as well as of forming a through-hole inside conductive part or wirings using the photolithographic method or plating method to cope with thermal resistance as well as miniaturization and density growth. However, in the case of thinly forming a conductive film on a through-hole inner wall, for example, by a plating method and then further filling the through-hole inside with a resin, there arises a problem that even if using a glass substrate having high thermal resistance, the thermal resistance as the whole wiring substrate is reduced. These problems similarly occur both in forming a multilayer wiring substrate and in forming a single layer wiring substrate serving also as a fundamental structure of the multilayer wiring substrate.

SUMMARY OF THE INVENTION

In view of the foregoing, it is an object of the present invention to provide a method for manufacturing a double-sided wiring glass substrate having high thermal resistance and having densely formed on the front and rear surfaces thereof minute wirings.

Means for Solving the Problems

To accomplish the above object, according to the present invention, there is provided a method for manufacturing a double-sided wiring glass substrate having electric wirings formed on the front and rear surfaces of a glass substrate, and a through-hole filled with a metal and penetrating the glass substrate, the respective electric wirings formed on the front and rear surfaces of the glass substrate being made electrically connective through the metal filling the through-hole, the method comprising the steps of: a first step of forming the through-hole in the glass substrate; and a second step of filling the through-hole inside with a metal by a plating method simultaneously using an electroless plating method and an electrolytic plating method.

According to the present invention, there is also provided a method for manufacturing a double-sided wiring glass substrate, wherein the metal filling the through-hole is composed of any one or more of copper, nickel, gold, silver, platinum, palladium, chromium and aluminum.

According to the present invention, there is also provided a method for manufacturing a double-sided wiring glass substrate, wherein a photosensitive glass substrate is used as the glass substrate, and the first step comprises: a step of exposing the glass substrate through a photomask to form a latent image on a part of the glass substrate in which the through-hole is formed, a step of subjecting the glass substrate to thermal treatment to crystallize the exposed part, and a step of removing by dissolving the crystallized part to form the through-hole in the glass substrate.

According to the present invention, there is also provided a method for manufacturing a double-sided wiring glass substrate, wherein the second step comprises: depositing, by an electroless plating method, a metal on a sidewall part of the through-hole while allowing a void part penetrating the glass substrate to remain in a central part of the through-hole, then sealing, by an electrolytic plating method, with a metal any one of opening parts of the void part in the front and rear surfaces of the glass substrate, and subsequently depositing, by an electrolytic plating method, a metal in the void part inside from the one sealed opening part to the other opening part to thereby fill the through-hole inside with the metal.

According to the present invention, there is also provided a method for manufacturing a double-sided wiring glass substrate, wherein the second step comprises: Sealing, by an electrolytic plating method, with a metal any one of opening parts of the through-hole in the front and rear surfaces of the glass substrate, then depositing, by an electroless plating method, a metal on a sidewall part of the through-hole while allowing a void part to remain in a central part of the through-hole, and subsequently depositing, by an electrolytic plating method, a metal in the void part inside from the one sealed opening part to the other opening part to thereby fill the through-hole inside with the metal.

According to the present invention, there is also provided a method for manufacturing a double-sided wiring glass substrate, wherein the metal deposited by the electroless plating method and the metal deposited by the electrolytic plating method are different in a type of metals.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
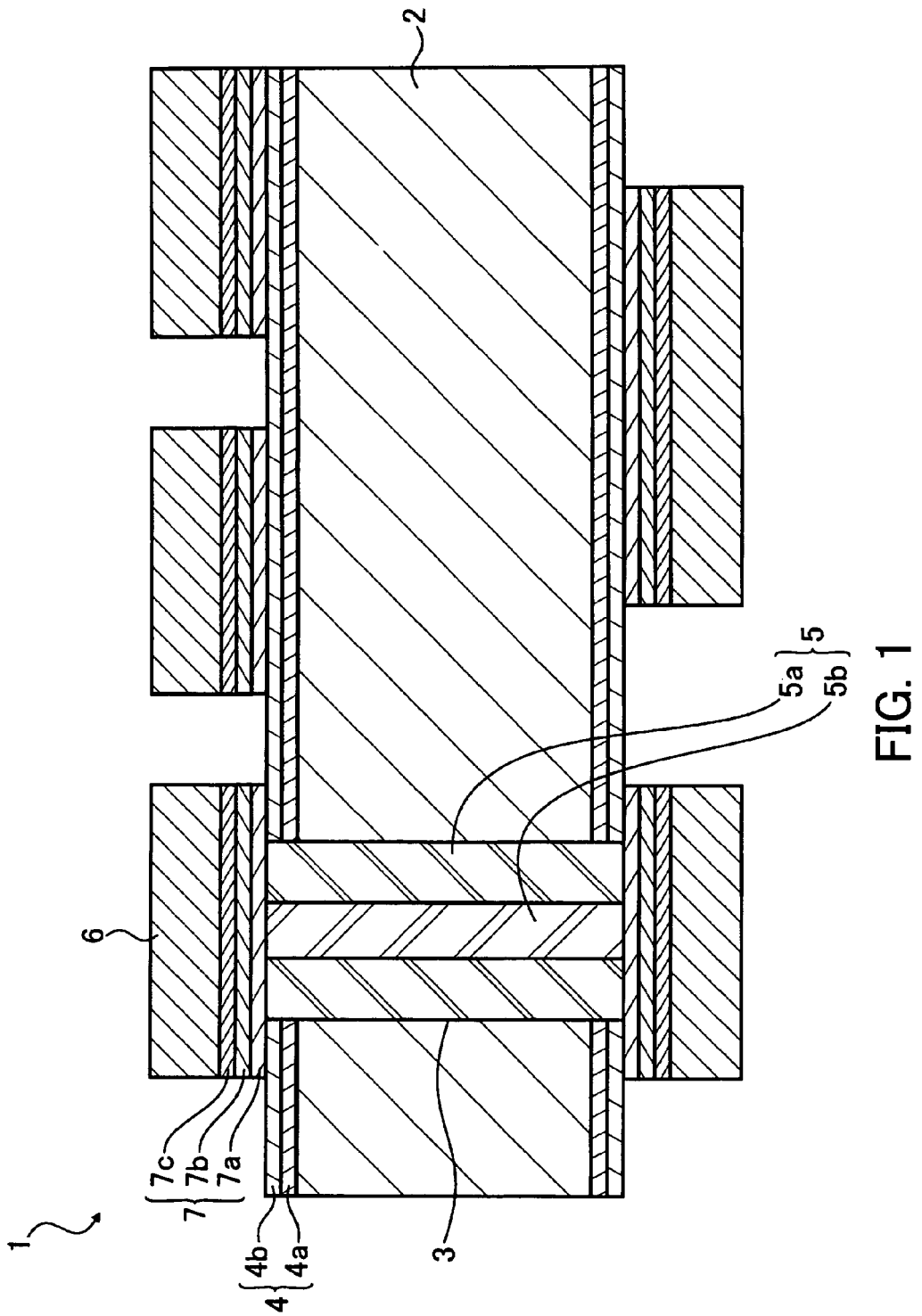
FIG. 1 is a sectional view of one example of a double-sided wiring glass substrate according to a first embodiment.

Preferred embodiments of the present invention will be described below with reference to the accompanying drawings, wherein like reference numerals refer to like elements throughout.

First, a first embodiment will be described.

FIG. 1 is a sectional view of one example of a double-sided wiring glass substrate according to a first embodiment.

In a double-sided wiring glass substrate 1, a photosensitive glass substrate 2 is used as a core substrate thereof. The substrate 2 has a through-hole 3 penetrating the substrate 2 and an ion blocking layer 4 formed on the front and rear surfaces of the substrate 2 to suppress leak of alkali metal ions contained in the photosensitive glass substrate 2. The through-hole 3 is filled with a copper film layer 5 composed of metallic copper (Cu). This layer 5 penetrates also the ion blocking layer 4. On the ion blocking layer 4 and the layer 5, a copper film layer 6 serving as wirings is formed with a predetermined wiring pattern through an adhesion-reinforcing layer 7. Thus, a front surface side and rear surface side of the double-sided wiring glass substrate 1 are electrically connected by the layer 5 and a part of the layer 7 and layer 6 formed on the layer 5.

Herein, the photosensitive glass substrate 2 is excellent as a core substrate material of a wiring substrate in terms of smoothness, hardness, insulation, and workability. These properties of the substrate 2 are the same as in chemically strengthened glass such as soda-lime glass, crystallized glass, alkali-free glass, and aluminosilicate glass. The glass can also be used for the core substrate of the double-sided wiring glass substrate 1.

The ion blocking layer 4 is composed of a silicon nitride ($Si_3N_4$) layer (hereinafter, referred to as a "sputtering silicon nitride layer") 4a formed by a sputtering method, and a silicon oxide ($SiO_2$) layer (hereinafter, referred to as a "sputtering silicon oxide layer") 4b formed by a sputtering method. Herein, the layer 4 has a two-layer structure where the sputtering silicon oxide layer 4b is laminated on the sputtering silicon nitride layer 4a formed on each of the front and rear surfaces of the photosensitive glass substrate 2. In the present invention, the layer 4 is not necessarily an essential constituent element, as described later.

The adhesion-reinforcing layer 7 is composed of a chromium (Cr) layer (hereinafter, referred to as a "sputtering chromium layer") 7a formed by a sputtering method, a mixed layer (hereinafter, referred to as a "sputtering chromium copper layer") 7b of chromium and copper formed by a sputtering method, and a copper layer (hereinafter, referred to as a "sputtering copper layer") 7c formed by a sputtering method. Herein, the adhesion-reinforcing layer 7 has a three-layer structure where the sputtering chromium layer 7a, the sputtering chromium copper layer 7b, and the sputtering copper layer 7c are laminated in sequence on the sputtering silicon oxide layer 4b.

The copper film layer 6 serving as wirings is formed on the sputtering copper layer 7c, and a part of the layer 6 is connected through the adhesion-reinforcing layer 7 to the copper film layer 5 filling the through-hole 3.

Next, a more detailed constitution of the double-sided wiring glass substrate 1 and a manufacturing method thereof will be described.

A manufacturing process of the double-sided wiring glass substrate 1 is roughly divided into a through-hole formation step, an ion blocking layer formation step, a through-hole filling step, an adhesion-reinforcing layer formation step and a wiring formation step.

Figure 2:
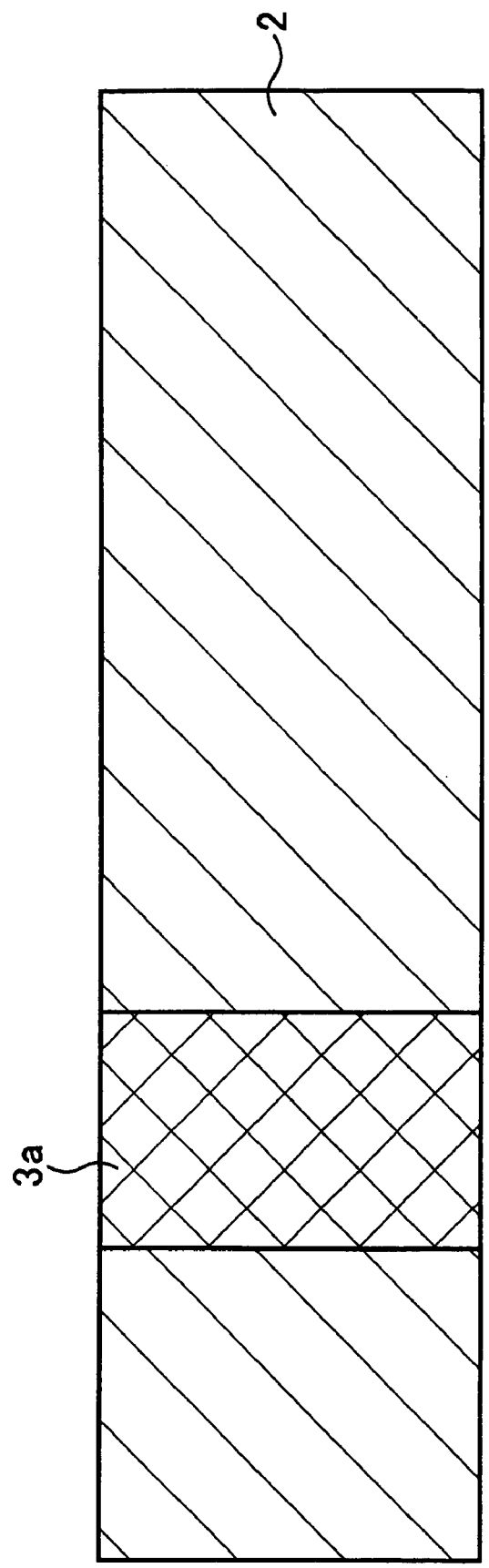
FIG. 2 is a sectional view of an exposure step according to a first embodiment.
Figure 3:
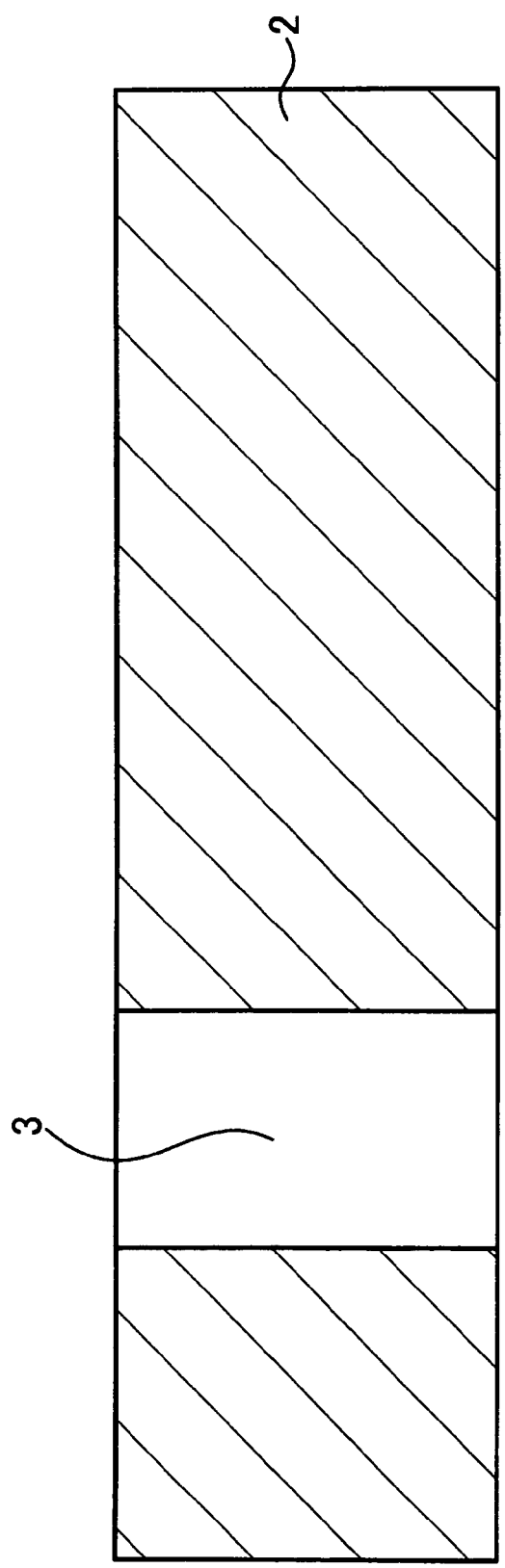
FIG. 3 is a sectional view of an exposure-crystallized part removal step according to a first embodiment.

First, the through-hole formation step will be described. FIGS. 2 and 3 are explanatory views of the through-hole formation step. FIG. 2 is a sectional view of an exposure step according to the first embodiment. FIG. 3 is a sectional view of an exposure-crystallized part removal step according to the first embodiment.

In the through-hole formation step, first, a photomask (not shown) having an opening part only in an area corresponding to a part (hereinafter, referred to as a "through-hole formation part") for forming the through-hole 3 is brought into close contact with and disposed on one surface side of the front and rear surfaces of the photosensitive glass substrate 2. In this state, ultraviolet rays are emitted onto the photosensitive glass substrate 2.

The photosensitive glass substrate 2 is not particularly limited, and any substrate may be used as long as it shows photosensitivity. The substrate 2 preferably contains as a photosensitive component thereof at least one of gold (Au), silver (Ag), cuprous oxide ($Cu_2O$) or cerium oxide ($CeO_2$), more preferably contains two or more thereof. As the substrate 2, for example, there can be used a glass substrate containing, in terms of wt %, 55 to 85% $SiO_2$, 2 to 20% $Al_2O_3$, 5 to 15% $Li_2O$, and $SiO_2+Al_2O_3+Li_2O>85\%$ as a basic component; 0.001 to 0.05% Au, 0.001 to 0.5% Ag, and 0.001 to 1% $Cu_2O$ as a photosensitive metallic component; and 0.001 to 0.2% $CeO_2$ as a photosensitizer.

Further, the photomask is not particularly limited, and any mask may be used as long as it can be brought into close contact with the photosensitive glass substrate 2 and allows selective exposure of the through-hole formation part. As the photomask, for example, there may be used a photomask made of a thin transparent plate glass having formed thereon a light shielding pattern using a film such as a chromium film substantially opaque to the exposure light such as ultraviolet rays.

After thus irradiating ultraviolet rays onto the through-hole formation part of the photosensitive glass substrate 2 through a photomask, this substrate 2 is subjected to thermal treatment. The thermal treatment is preferably performed at a temperature between the transition point and deformation point of the substrate 2 used. This is because at temperatures lower than the transition point, satisfactory thermal treating effects are not obtained, and at temperatures exceeding the deformation point, shrinkage of the substrate 2 occurs, which may cause lowering of the exposure dimensional accuracy. The thermal treatment is preferably performed for a period of about 30 minutes to 5 hours.

Through the ultraviolet irradiation and the thermal treatment, the through-hole formation part irradiated with ultraviolet rays is crystallized, whereby an exposure-crystallized part 3a is formed on the through-hole formation part of the photosensitive glass substrate 2, as shown in FIG. 2. Subsequently, an etching solution such as dilute hydrofluoric acid having a predetermined concentration is sprayed on the substrate 2 having formed therein the part 3a, whereby the part 3a is selectively removed by resolution from the substrate 2. Thus, the through-hole 3 is formed in the substrate 2, as shown in FIG. 3.

According to the forming method of the through-hole 3 using the photolithographic method, just a desired number of the through-holes 3 with an aspect ratio of about 10 can be simultaneously formed in the photosensitive glass substrate 2. For example, in the case of using the substrate 2 having a thickness of about 0.3 to 1.5 mm, a plurality of the through-holes 3 with a diameter of about 30 to 150 μm can be formed simultaneously at desired locations. As a result, formation of fine wiring patterns and improvement of efficiency in the through-hole formation step can be attained. Further, in the case of employing a landless structure in which the land width is reduced to a very small value or zero in order to increase the density of wiring patterns, a sufficiently large space can be secured between the through-holes 3. As a result, wirings can be formed also in the space between the through-holes 3, so that the degree of freedom in wiring pattern design can be expanded as well as the wiring density can be increased. Further, a plurality of the through-holes 3 can be formed at a narrow pitch, so that the wiring density can be increased.

When using other glass substrates having no photosensitivity as in the photosensitive glass substrate 2, a through-hole can be formed, for example, by laser irradiation.

Figure 4:
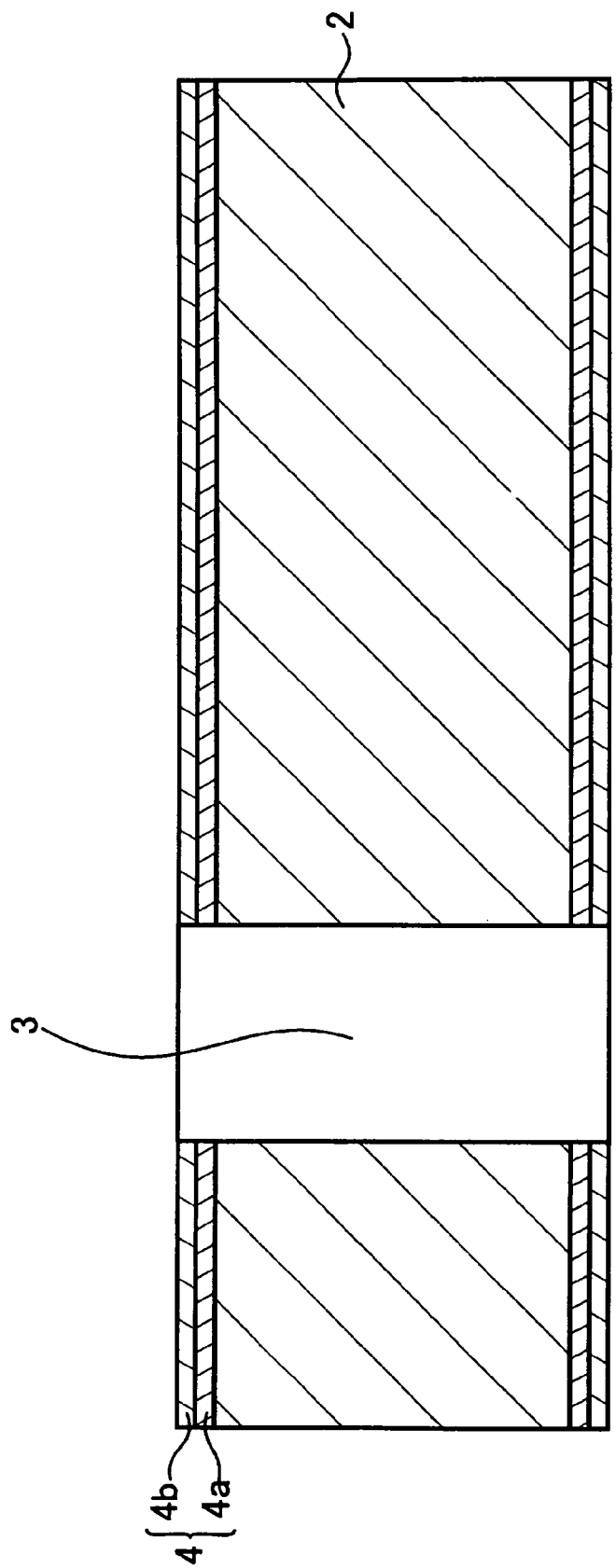
FIG. 4 is a sectional view of an ion blocking layer formation step according to a first embodiment.

Next, an ion blocking layer formation step will be described. FIG. 4 is a sectional view of the ion blocking layer formation step according to the first embodiment.

The photosensitive glass substrate 2 usually contains alkali metal ions such as a lithium ion ($Li^+$) and a potassium ion ($K^+$). When these alkali metal ions leak from the substrate 2 to a wiring metal of the double-sided wiring glass substrate 1 and further, water is adsorbed to the wiring metal, there is caused an ion migration phenomenon that the wiring metal is ionized between circuits to which a voltage is applied, and the ionized wiring metal is reduced by receiving a charge to allow the metal to be separated out again. Due to the ion migration, in the worst case, a wiring which goes from one circuit to another circuit is formed by the separated metal and as a result, a short circuit is caused between circuits. Such a short-circuit defect becomes remarkable when a space between wirings is small. Therefore, in order to form fine wirings with high density, the ion migration must be inhibited. For that purpose, the ion blocking layer 4 is formed on the front and rear surfaces of the photosensitive glass substrate 2 to thereby suppress leak of alkali metal ions from the substrate 2 to the copper film layer 6 or the adhesion-reinforcing layer 7. Further, when forming the layer 4, even if the substrate 2 has a thin film, a sufficient insulation resistance can be secured between the front and rear surfaces of the substrate 2.

When forming the ion blocking layer 4, the photosensitive glass substrate 2 is first subjected to dealkalization treatment for removing alkali metal ions contained in the front and rear surface areas of the substrate 2. The dealkalization treatment is performed by immersing the substrate 2 in an electrolyte such as a sulfuric-acid aqueous solution, and then applying a voltage to the substrate 2 to allow the alkali metal ions contained in the front and rear surface areas of the substrate 2 to be eluted in the electrolyte.

After completion of the above-described dealkalization treatment, the ion blocking layer 4 is formed on each of the front and rear surfaces of the photosensitive glass substrate 2, as shown in FIG. 4. For the ion blocking layer 4, any of organic and inorganic materials may be used. A material which has insulation as well as small difference in thermal expansion coefficient between the substrate 2 and the layer 4 and which is excellent in electrical characteristics such as thermal resistance, moisture resistance, a dielectric constant or a dielectric dissipation factor is preferably used. Materials satisfying these requirements include silicon oxide, silicon nitride and aluminum oxide. Among these, silicon oxide and silicon nitride are more preferred in that a defect such as a pinhole is hardly formed and a withstand voltage is high. The film forming method is not particularly limited and a sputtering method, a vacuum deposition method, and a CVD (Chemical Vapor Deposition) method may be used. In terms of providing high adhesion, a sputtering method is preferably used. Herein, as shown in FIG. 4, the sputtering silicon nitride layer 4a having a film thickness of about 0.05 µm is first formed on each of the front and rear surfaces of the substrate 2 after the dealkalization treatment and then, a sputtering silicon oxide layer 4b having a film thickness of about 0.05 µm is formed on the layer 4a. Thus, the layer 4 is constituted.

Herein, the ion blocking layer 4 is formed after dealkalizing the photosensitive glass substrate 2; however, the layer 4 may be formed without dealkalizing the substrate 2. Further, the layer 4 is herein constituted to have a two-layer structure; however, the layer 4 may be constituted to have a structure of a single layer or three layers or more depending on the materials used. Further, depending on the use environment or demand characteristics of the double-sided wiring glass substrate 1, the formation of the layer 4 may be omitted by performing only the dealkalization treatment of the substrate 2.

Further, the ion blocking layer 4 is not an essential layer and is no longer required by subjecting the photosensitive glass substrate 2 to the following crystallization treatment. That is, in the crystallization treatment, the whole substrate 2 having formed therein the through-hole 3 is irradiated with ultraviolet rays and then is subjected to thermal treatment. As a result, the whole substrate 2 is crystallized. In this case, a thermal treatment temperature is preferably set to a temperature between a crystallization temperature and softening point of the substrate 2. For example, thermal treatment conditions at 850° C. for two hours are preferable. When thus crystallizing the whole substrate 2, alkali metal ions contained in the substrate 2 can be made into a state of difficulty in moving as compared with a state before the crystallization. Therefore, ion migration can be suppressed, and as a result, formation of the ion blocking layer 4 is no longer required. Hereinafter, the crystallization treatment step of the whole substrate 2, which is performed after the formation of the through-hole 3, is referred to as a "glass substrate reforming step".

Figure 5:
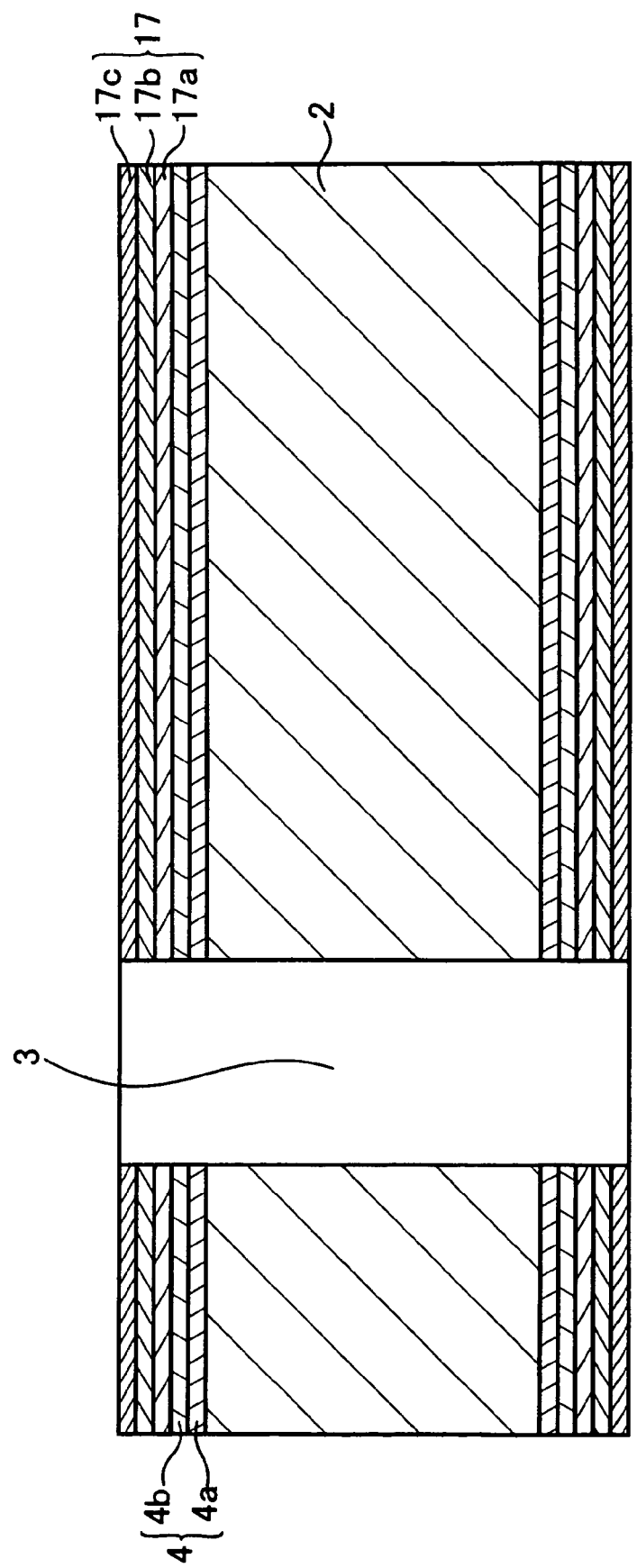
FIG. 5 is a sectional view of a preliminary adhesion-reinforcing layer formation step according to a first embodiment.
Figure 6:
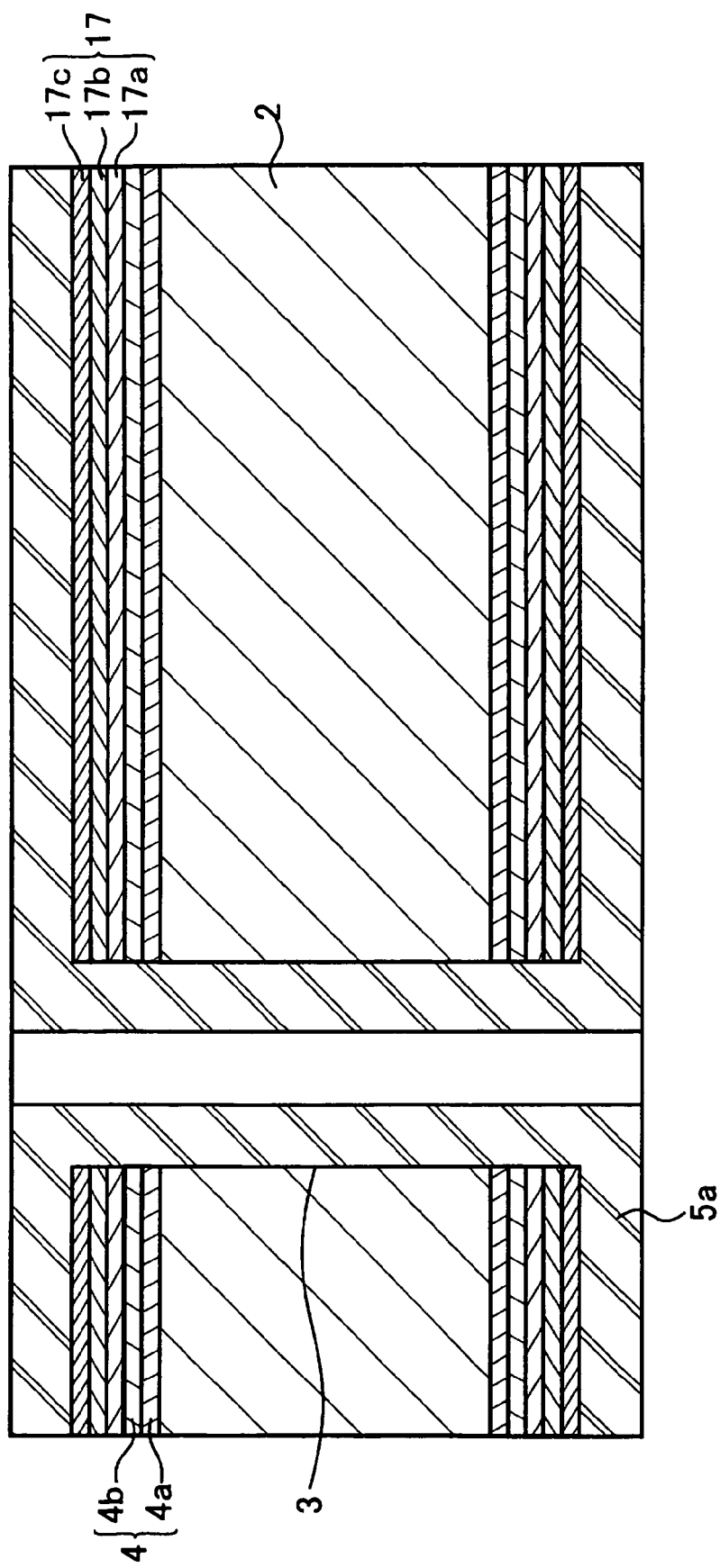
FIG. 6 is a sectional view of an electroless plating step according to a first embodiment.
Figure 7:
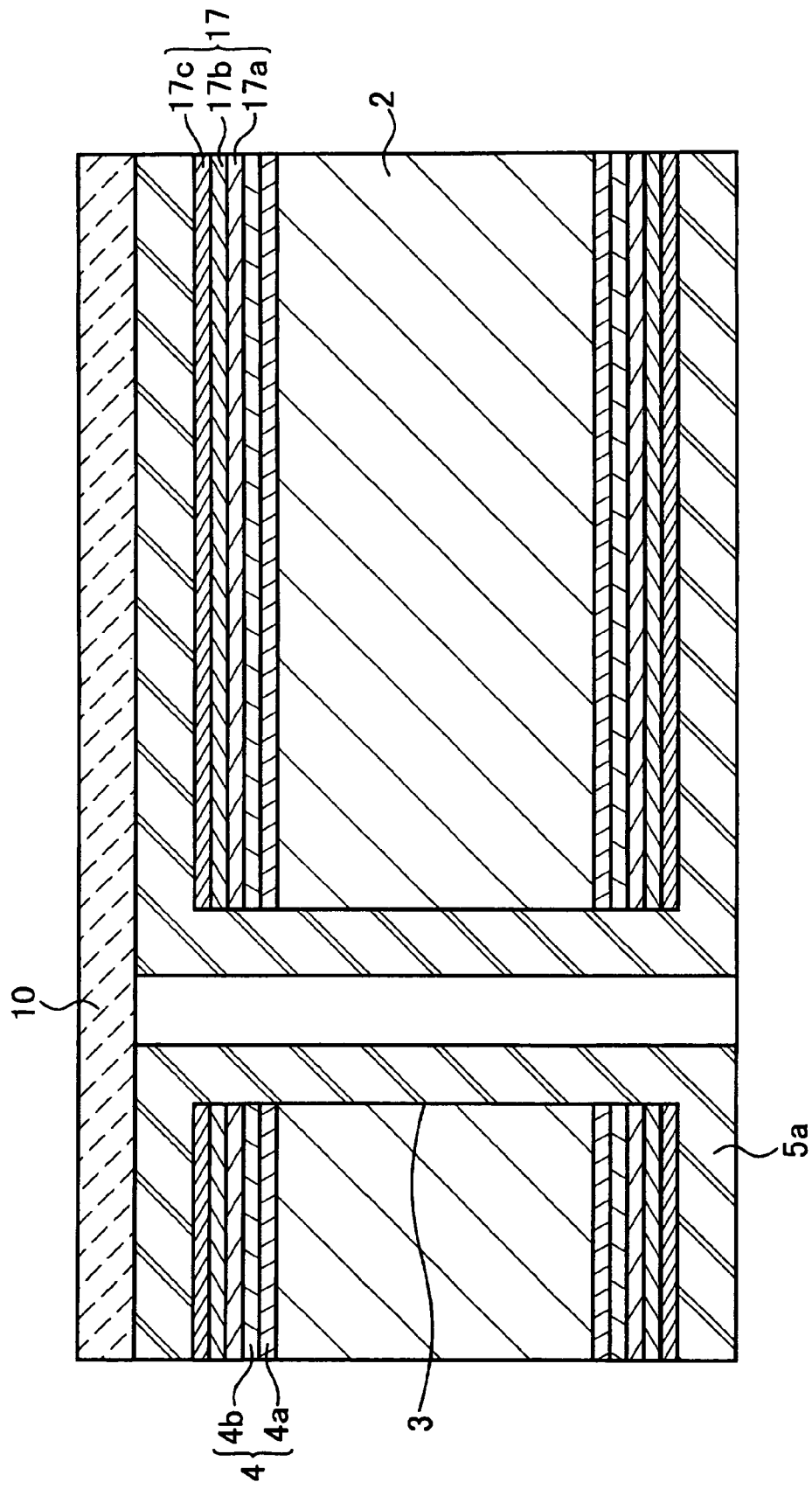
FIG. 7 is a sectional view of an opening part sealing step according to a first embodiment.
Figure 8:
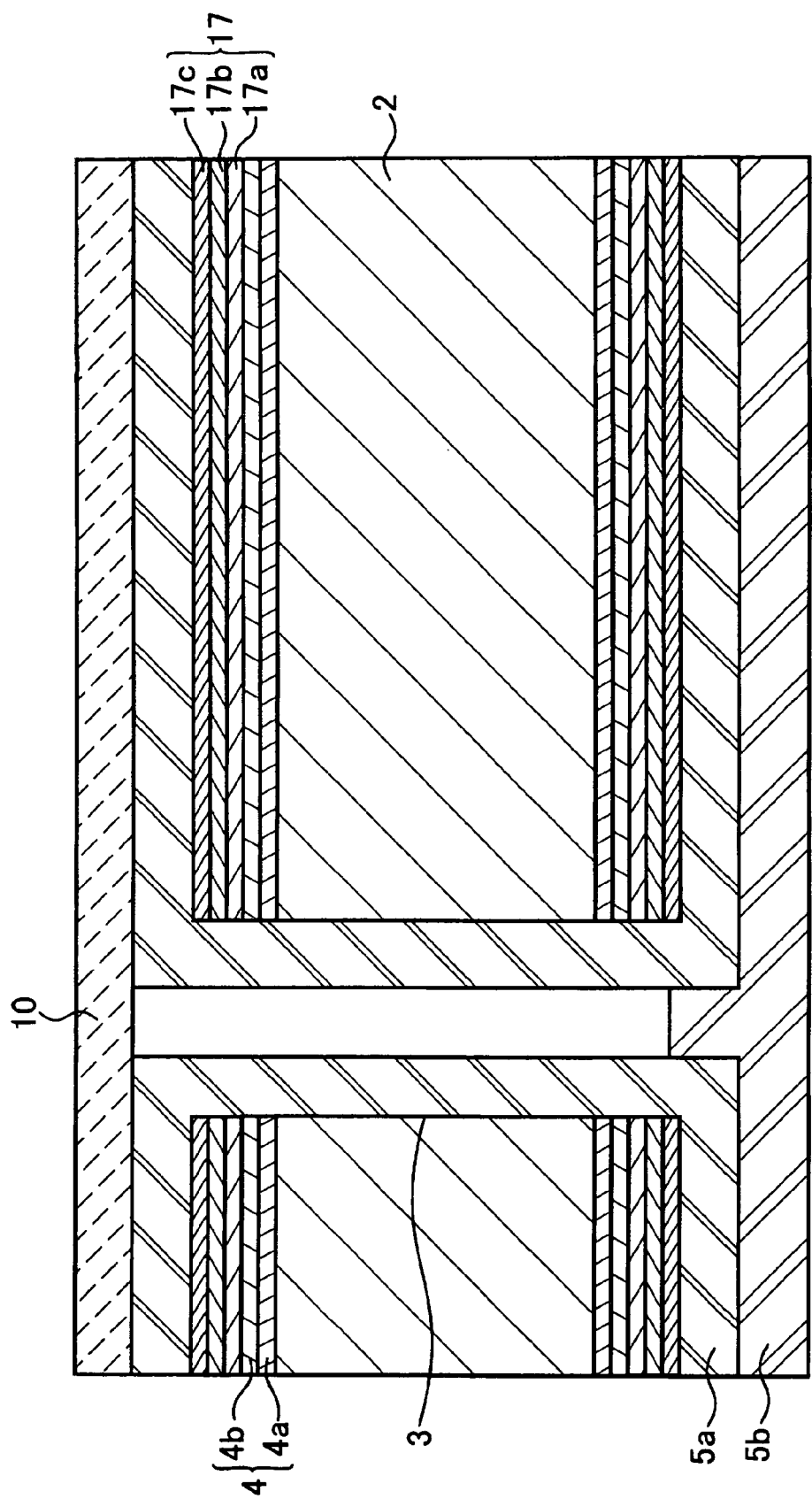
FIG. 8 is a first sectional view of an electrolytic plating step according to a first embodiment.
Figure 9:
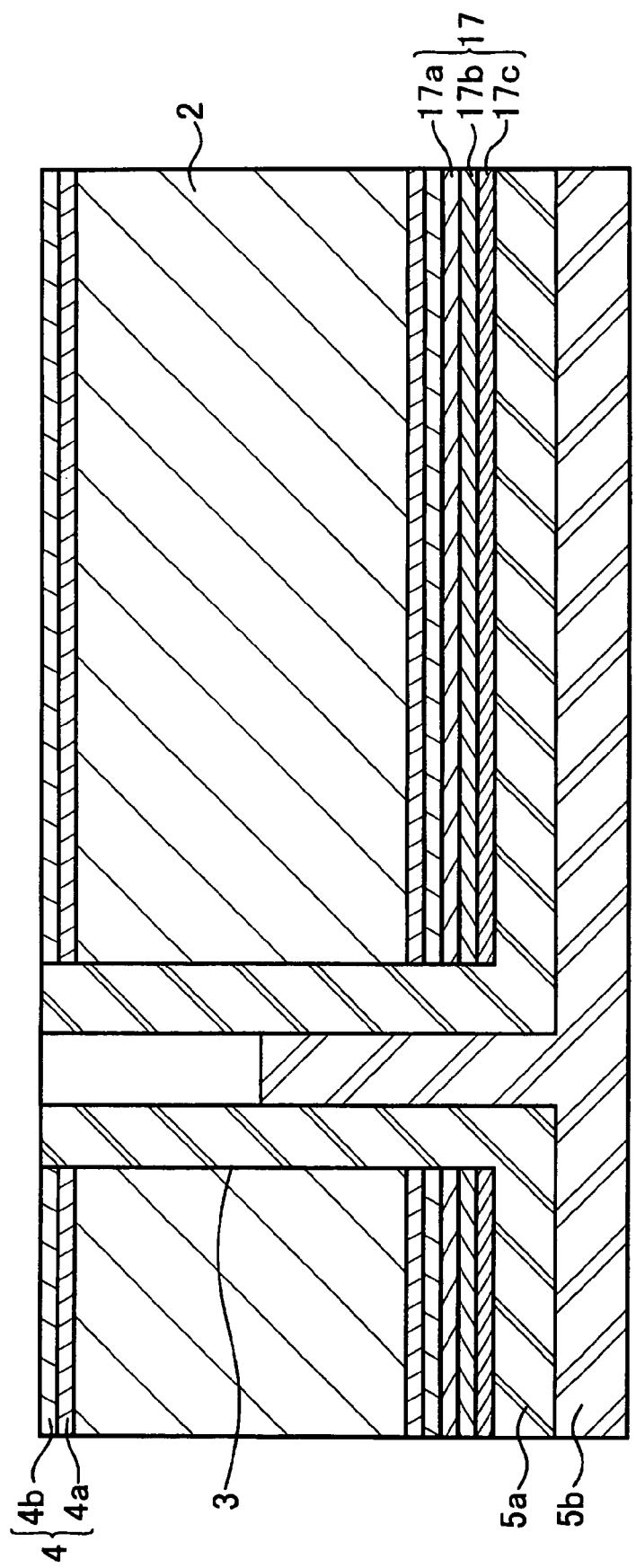
FIG. 9 is a second sectional view of an electrolytic plating step according to a first embodiment.
Figure 10:
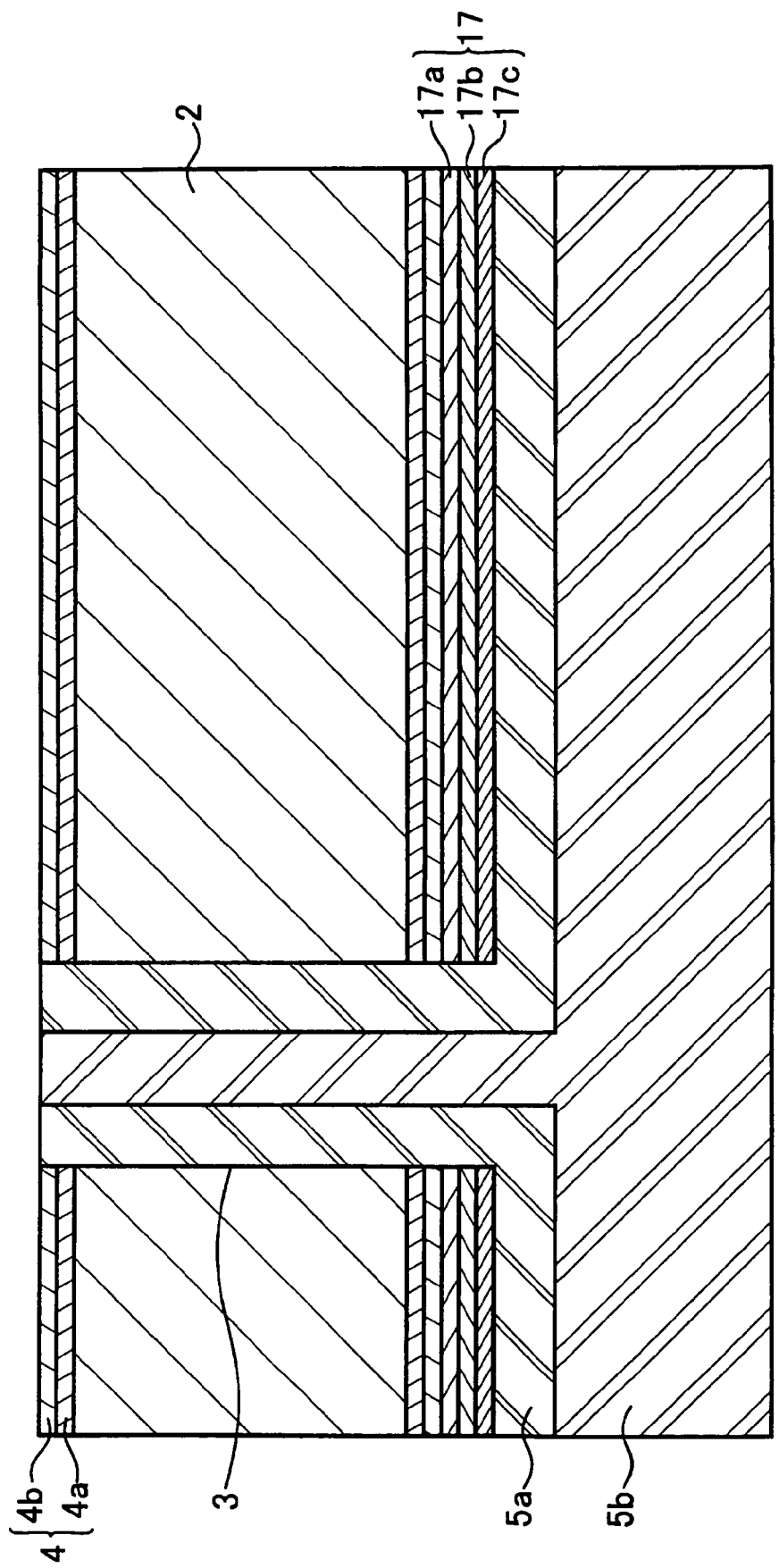
FIG. 10 is a third sectional view of an electrolytic plating step according to a first embodiment.
Figure 11:
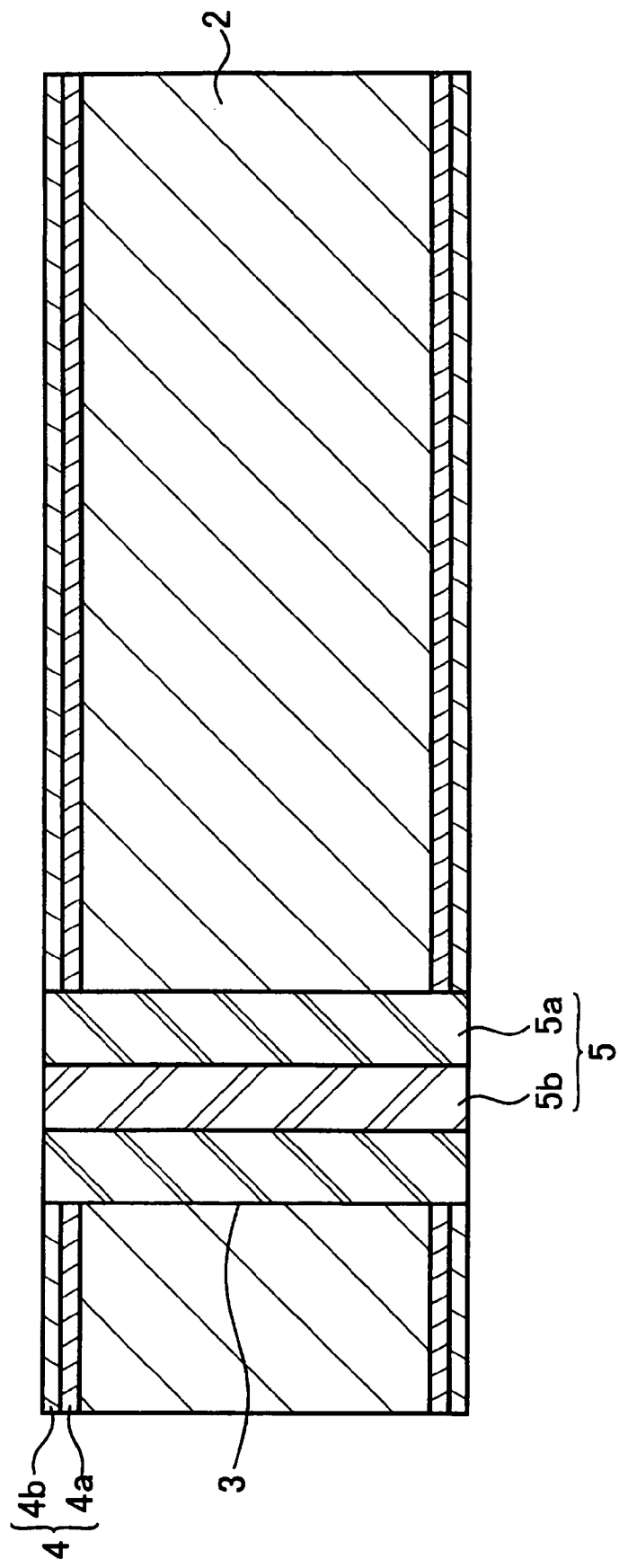
FIG. 11 is a sectional view of a metal layer removal step according to a first embodiment.

Next, the through-hole filling step will be described. FIGS. 5 to 11 are explanatory views of the through-hole filling step, FIG. 5 is a sectional view of a preliminary adhesion-reinforcing layer formation step according to the first embodiment. FIG. 6 is a sectional view of an electroless plating step according to the first embodiment. FIG. 7 is a sectional view of an opening part sealing step according to the first embodiment. FIG. 8 is a first sectional view of an electrolytic plating step according to the first embodiment. FIG. 9 is a second sectional view of an electrolytic plating step according to the first embodiment. FIG. 10 is a third sectional view of an electrolytic plating step according to the first embodiment. FIG. 11 is a sectional view of a metal layer removal step according to the first embodiment.

In the through-hole filling step, the preliminary adhesion-reinforcing layer 17 is first formed on the ion blocking layer 4, as shown in FIG. 5. Formation of this preliminary adhesion-reinforcing layer 17 is performed in order that during formation of the plating metal layer on the through-hole 3 wall surface using the after-described plating method for filling the through-hole 3 with a metal, the plating metal layer formed on the through-hole 3 wall surface as well as on the substrate front and rear surfaces may be prevented from peeling. The reason is that the plating metal layer formed on the substrate front and rear surfaces is removed at some stage during the through-hole filling step; however, when peeling of the plating metal layer from the substrate front and rear surfaces occurs before the removal, peeling of the plating metal layer formed on the through-hole 3 wall surface also occurs at the same time and as a result, a defect in continuity may be caused. In the case where adhesion between the plating metal layer simultaneously formed on the through-hole 3 wall surface as well as on the substrate front and rear surfaces, namely, the metal filling the through-hole 3 and the ion blocking layer 4 is poor, the preliminary adhesion-reinforcing layer 17 is formed on the ion blocking layer 4 to enhance adhesion strength of the plating metal layer, and as a result, the peeling of the plating metal layer is suppressed.

The preliminary adhesion-reinforcing layer 17 has a structure such that a layer having good adhesion with both of the metal filling the through-hole 3 and the ion blocking layer 4 is formed on the ion blocking layer 4 using a sputtering method, a vacuum deposition method, and a CVD (Chemical Vapor Deposition) method. For example, the layer 17 may have a three-layer structure such that a first layer composed of materials having good adhesion with the ion blocking layer 4, a third layer composed of materials having good adhesion with the metal filling the through-hole 3 and a second layer composed of both of the first layer materials and the third layer materials are laminated on the ion blocking layer 4 in the order corresponding to the first layer, the second layer and the third layer. When adhesion between the first layer and the third layer is sufficiently obtained, the layer 17 may also have a two-layer structure such that the second layer is omitted. Further, depending on the metal filling the through-hole 3 and depending on the ion blocking layer 4 materials, the layer 17 may also be formed by a single layer composed of materials having good adhesion with both the materials. Further, when forming no ion blocking layer 4, a layer having good adhesion with both of the metal filling the through-hole 3 and the photosensitive glass substrate 2 is formed as the preliminary adhesion-reinforcing layer 17. Also in this case, the layer 17 may have a structure of a single layer, two layers or three layers.

In the first embodiment, copper is used as a metal filling the through-hole 3. In this case, metal materials such as chromium, tantalum and titanium can be used for the preliminary adhesion-reinforcing layer 17. Herein, the layer 17 is formed using chromium, and has a three-layer structure composed of the sputtering chromium layer 17a, which has good adhesion with the sputtering silicon oxide layer 4b, the sputtering copper layer 17c, which has good adhesion with copper, and the sputtering chromium-copper layer 17b interposed between these layers. Also in the case of forming no ion blocking layer 4, that is, in the case of forming the preliminary adhesion-reinforcing layer 17 on the photosensitive glass substrate 2, the layer 17 can be formed to have the same constitution as the above. A thickness of each metal layer constituting the layer 17 is not particularly limited. In the case of thus using chromium, for example, the sputtering chromium layer 17a preferably has a thickness of about 0.04 to 0.1 µm, the sputtering chromium-copper layer 17b as the intermediate layer preferably has a thickness of about 0.04 to 0.1 µm, and the sputtering copper layer 17c preferably has a thickness of about 0.5 to 1.5 µm.

After thus forming the preliminary adhesion-reinforcing layer 17 on the ion blocking layer 4, the through-hole 3 is filled with copper. As described above, a plating method is used for the filling of the through-hole 3 with copper. In the first embodiment, the electroless plating method and the electrolytic plating method are simultaneously used. The electroless plating is used mainly for making electrically connective a through-hole 3 wall surface of the photosensitive glass substrate 2. In terms of a high deposition rate and high coating thermal resistance, the electrolytic plating is used mainly for efficiently depositing and filling copper in the through-hole 3 inside after making the through-hole 3 wall surface electrically connective by the electroless plating.

First, a thin electroless plating layer (hereinafter, referred to as an "electroless plating copper layer") 5a composed of copper and having a thickness of 1 μm or less is formed on the through-hole 3 wall surface by the electroless plating method, as shown in FIG. 6. On this occasion, the electroless plating copper layer 5a is formed on the through-hole 3 wall surface as well as on the preliminary adhesion-reinforcing layer 17 formed on the substrate front and rear surfaces, as described above. The layer 17 prevents peeling of the electroless plating copper layer 5a from the substrate front and rear surfaces.

Subsequently, as shown in FIG. 7, an insulating adhesive tape 10 is attached to seal an opening part of the through-hole 3 in any one of the front and rear surface sides of the substrate. Hereinafter, a surface having attached thereon this adhesive tape 10 is designated as a substrate front surface and a surface opposite to the substrate front surface is designated as a substrate rear surface. The adhesive tape 10 prevents copper from adhering to the substrate front surface in the following electrolytic plating step. Herein, the opening part of the through-hole 3 is sealed with the adhesive tape 10. Further, the opening part of the through-hole 3 may be sealed with other materials.

After sealing with the adhesive tape 10 the opening part of the through-hole 3 in the substrate front surface side, an electrolytic plating layer (hereinafter, referred to as an "electrolytic plating copper layer") 5b composed of copper is formed by the electrolytic plating method, whereby the opening part of the through-hole 3 in the substrate rear surface side is sealed with this electrolytic plating copper layer 5b, as shown in FIG. 8. It is preferable that the electrolytic plating process is herein performed, for example, by applying current using a copper plate as an anode as well as using the substrate as a cathode in a state where the substrate rear surface side is faced to the copper plate in a plating bath of a copper sulfate aqueous solution as a plating solution. Depending on a diameter of the through-hole 3, the formation of the electrolytic plating copper layer 5b is performed under the condition that a current density is relatively higher than usual from about 1 to 5 A/dm². Further, the current density also depends on a plating solution concentration and therefore, a value of the current density is appropriately set. Generally, in the case where the plating solution concentration is high, the current density can be set higher than a case where the plating solution concentration is low. By performing the electrolytic plating under these current density conditions, the opening part of the through-hole 3 can be sealed with the electrolytic plating copper layer 5b. Hereinafter, this plating process is referred to as an "opening part sealing plating".

After sealing with the layer 5b the opening part of the through-hole 3 in the substrate rear surface side, the adhesive tape 10 is detached. Further, the electroless plating copper layer 5a and preliminary adhesion-reinforcing layer 17 formed on the substrate front surface side are removed, whereby the ion blocking layer 4 is exposed. Examples of the removal method of these respective metal layers include a lapping method, an etching method, and a combination method of the lapping method and the etching method. Thereafter, the electrolytic plating copper layer 5b is further formed by the electrolytic plating method, whereby the through-hole 3 inside is filled with the layer 5b as shown in FIGS. 9 and 10. On this occasion, the electrolytic plating is performed, for example, by applying current using a copper plate as an anode as well as using a substrate as a cathode in a copper sulfate aqueous solution in the same manner as in the above-described electrolytic plating. Note, however, that the electrolytic plating is herein preferably performed in a state where the substrate front surface side, namely, opening part side where the through-hole 3 is not sealed after detaching the adhesive tape 10 is faced to the copper plate. Depending on a diameter of the through-hole 3 or a plating solution concentration, the formation of the electrolytic plating copper layer 5b is herein performed under the condition that a current density is as relatively low as about 0.2 to 0.8 A/dm². By performing the electrolytic plating under these current density conditions, the electrolytic plating copper layer 5b is sequentially formed on the layer 5b previously formed within the through-hole 3 and therefore, there can be avoided a situation that before the whole through-hole 3 is filled with metallic copper, the opening part of the through-hole 3 is sealed. Further, the ion blocking layer 4 is insulating and therefore, no electrolytic plating copper layer 5b is formed on the layer 4. By thus performing the electrolytic plating at different current densities, the through-hole 3 can be filled with metallic copper from the opening part side where the through-hole 3 is sealed. Hereinafter, this plating process is referred to as "filling plating". The electrolytic plating copper layer 5b may be projected and formed also on the substrate front surface side. FIG. 10 shows a state after removing such a projecting part using the lapping method.

After filling the through-hole 3 with the electrolytic plating copper layer 5b, the electrolytic plating copper layer 5b, electroless plating copper layer 5a and preliminary adhesion-reinforcing layer 17 formed on the substrate rear surface are removed, whereby the ion blocking layer 4 is exposed as shown in FIG. 11. Examples of the removal method of these respective metal layers include a lapping method, an etching method, and a combination method of the lapping method and the etching method. Thus, the electroless plating copper layer 5a and the electrolytic plating copper layer 5b are allowed to remain in the through-hole 3, and as a result, the through-hole 3 is filled with the copper film layer 5 composed of metallic copper, as shown in FIG. 11. Further, after the formation of the electroless plating copper layer 5a, the electrolytic plating copper layer 5b is formed to fill the through-hole 3 with metallic copper. Therefore, the through-hole 3 can be efficiently filled close with metallic copper.

In the case of passing through the above-described glass substrate reforming step, the ion blocking layer 4 is no longer required. Therefore, in FIG. 11, the glass substrate has a state where when removing the preliminary adhesion-reinforcing layer 17, the ion blocking layer 4 is absent, that is, the crystallized photosensitive glass substrate 2 is exposed.

Figure 12:
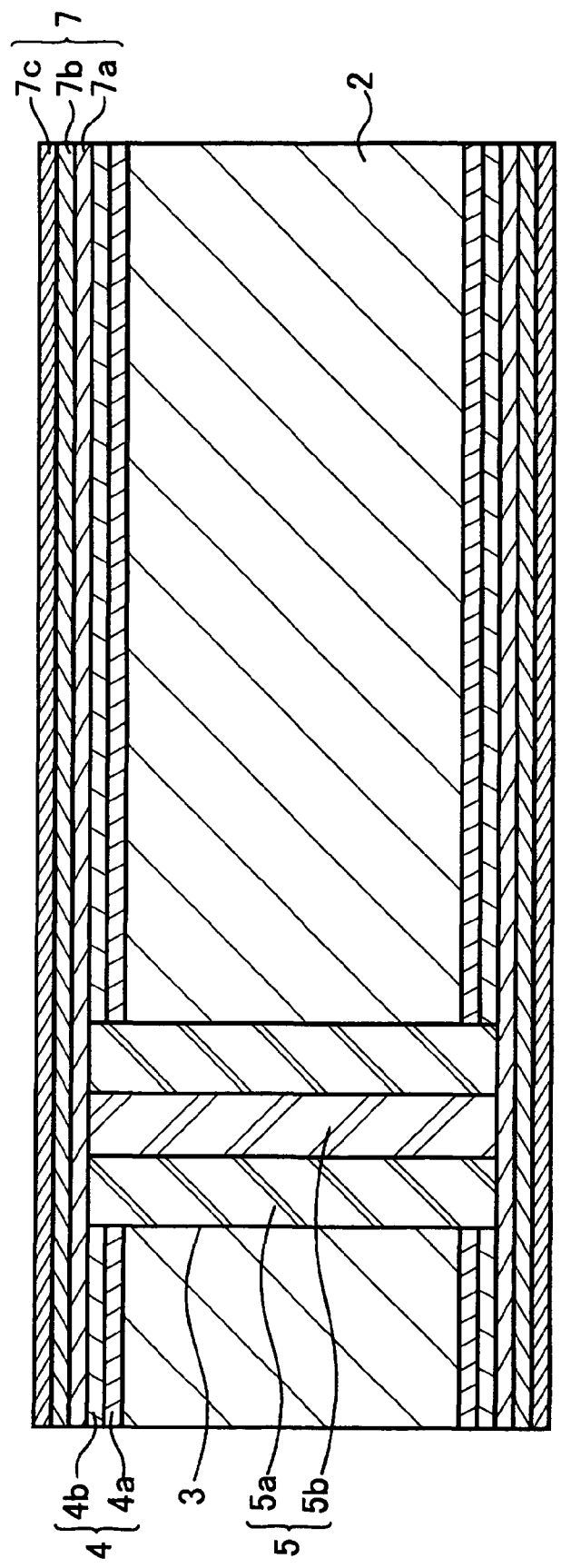
FIG. 12 is a sectional view of an adhesion-reinforcing layer formation step according to a first embodiment.

Next, the adhesion-reinforcing layer formation step will be described. FIG. 12 is a sectional view of the adhesion-reinforcing layer formation step according to the first embodiment.

In the adhesion-reinforcing layer formation step, the adhesion-reinforcing layer 7 is formed on the exposed ion blocking layer 4 after filling of the through-hole 3 with the copper film layer 5, as shown in FIG. 12. The layer 7 is a layer for securing adhesion between the ion blocking layer 4 and the copper film layer 6 subsequently formed as wirings. A material, layer structure and forming method of the layer 7 are the same as those of the preliminary adhesion-reinforcing layer 17. Further, the same is true in the case of forming no ion blocking layer 4.

However, the adhesion-reinforcing layer 7 and the preliminary adhesion-reinforcing layer 17 have the following differences in a thickness thereof. That is, each of the metal layers constituting the adhesion-reinforcing layer 7 is preferably formed to have a thickness as small as possible, in view of the amount of side etching in the wiring pattern formation by etching described later. However, if the thickness of each of the metal layers constituting the adhesion-reinforcing layer 7 is too small, the adhesion-reinforcing layer 7 may be removed, before the wiring formation, through a treatment performed during the wiring formation, and therefore, attention is required. For example, in the case of using chromium for the adhesion-reinforcing layer 7, the sputtering chromium layer 7a preferably has a thickness of about 0.04 to 0.1 μm, the sputtering chromium-copper layer 7b as the intermediate layer preferably has a thickness of about 0.04 to 0.1 μm, and the sputtering copper layer 7c preferably has a thickness of about 0.5 to 1.5 μm. Thus, in this step, a very thin adhesion-reinforcing layer 7 with an overall thickness of 2 μm or less is formed.

Figure 13:
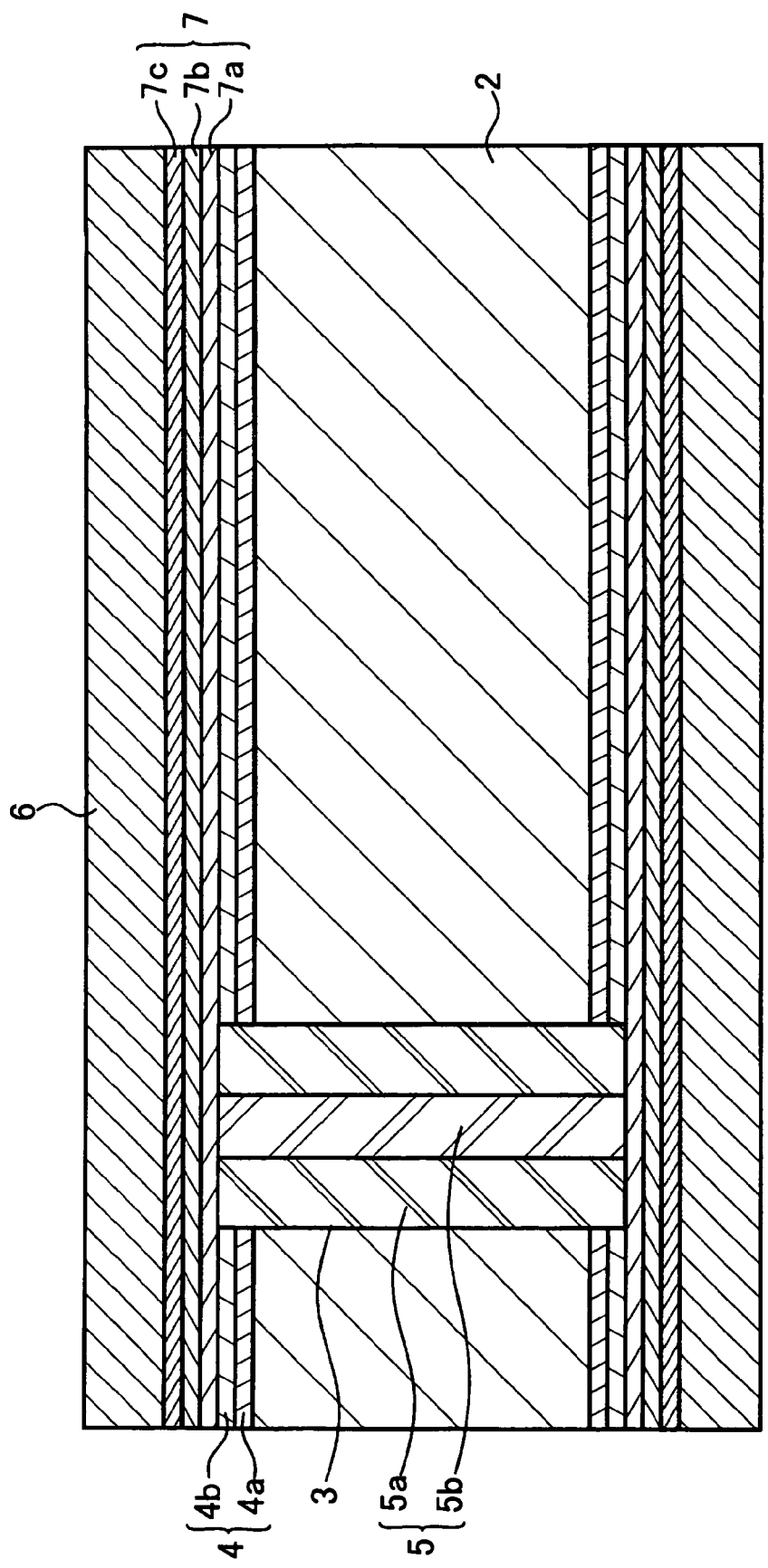
FIG. 13 is a sectional view of a wiring formation step according to a first embodiment.

Subsequently, the wiring formation step will be described. FIG. 13 is a sectional view of the wiring formation step according to the first embodiment.

In the wiring formation step, the copper film layer 6 is first formed on the adhesion-reinforcing layer 7 using the electrolytic plating method as shown in FIG. 13. In the same manner as in the adhesion-reinforcing layer 7, the copper film layer 6 is preferably formed to have a thickness as small as possible, in view of the amount of side etching. However, in the case where temperature changes of the double-sided wiring glass substrate 1 are repeated due to use environment, when the copper film layer 6 is too thin, metal fatigue may occur in the copper film layer 6 due to the difference in coefficient of thermal expansion between the copper film layer 6 and the photosensitive glass substrate 2. Therefore, in order to ensure connection reliability of the copper film layer 6 against the metal fatigue, the copper film layer 6 needs to have a somewhat large thickness. The thickness of the copper film layer 6 is preferably set to about 1 to 20 μm more preferably about 4 to 7 μm. If the thickness of the copper film layer 6 is smaller than 1 μm, it is highly possible that disconnection of the copper film layer 6 will be caused due to the metal fatigue described above; on the other hand, if the thickness of the copper film layer 6 is larger than 20 μm, it is difficult to form a fine wiring pattern.

After the formation of the copper film layer 6, a wiring pattern is formed by the photolithographic method and etching. First, a resist pattern corresponding to the wiring pattern of the double-sided wiring glass substrate 1 is formed using the photolithographic method. Next, the copper film layer 6, sputtering copper layer 7c, sputtering chromium-copper layer 7b and sputtering chromium layer 7a which are in areas not covered with the resist are removed by etching, thus forming the wiring pattern. As a result, the double-sided wiring glass substrate 1 having the constitution shown in FIG. 1 is obtained. The resist used herein may be a liquid resist, a dry film resist, or an electrodeposited resist. Also, the resist type may be either positive or negative; however, a positive resist is suited for the formation of fine wiring pattern since it generally provides higher resolution.

Next, a second embodiment will be described.

A constitution of the double-sided wiring glass substrate according to the second embodiment is the same as that of the double-sided wiring glass substrate 1 according to the first embodiment. The substrate according to the second embodiment and the substrate 1 according to the first embodiment have many differences in the manufacturing method thereof.

A manufacturing process of the double-sided wiring glass substrate according to the second embodiment is roughly divided into a through-hole formation step, a glass substrate reforming step, a through-hole filling step, an adhesion-reinforcing layer formation step and a wiring formation step. Among these steps, the through-hole formation step, the glass substrate reforming step, the adhesion-reinforcing layer formation step and the wiring formation step are the same as those of the first embodiment. Therefore, the through-hole filling step will be described below with reference to FIGS. 14 to 20.

Figure 14:
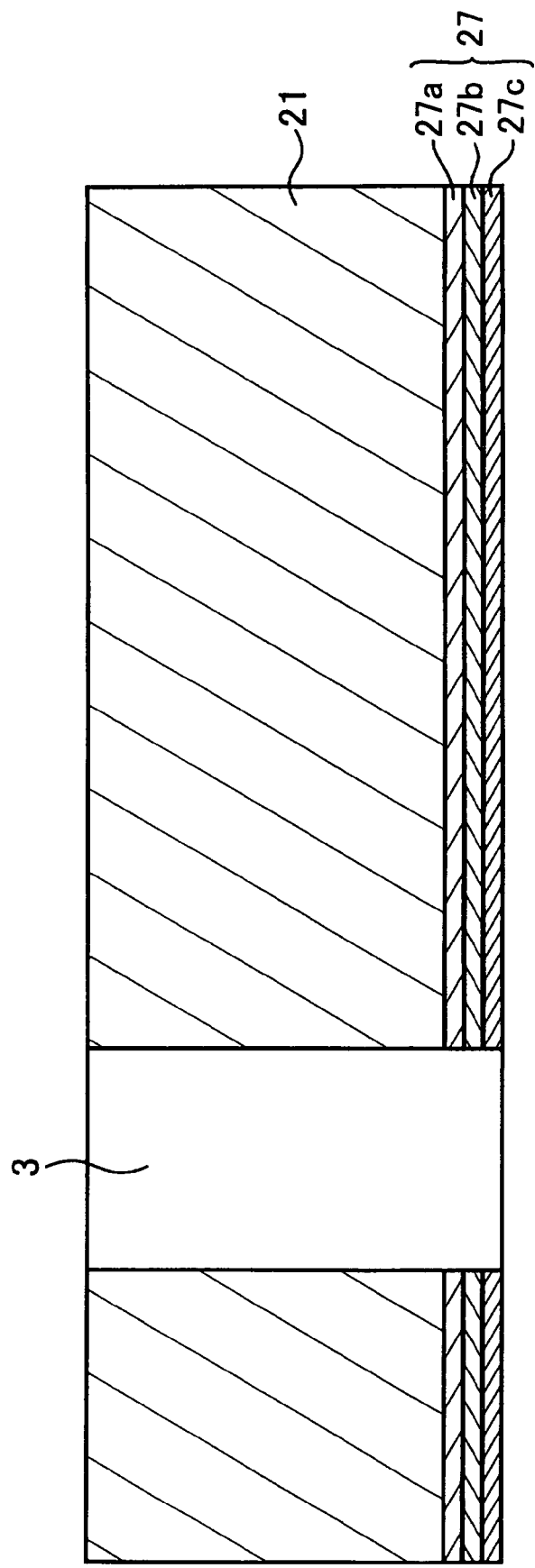
FIG. 14 is a sectional view of an electrode layer formation step according to a second embodiment.
Figure 15:
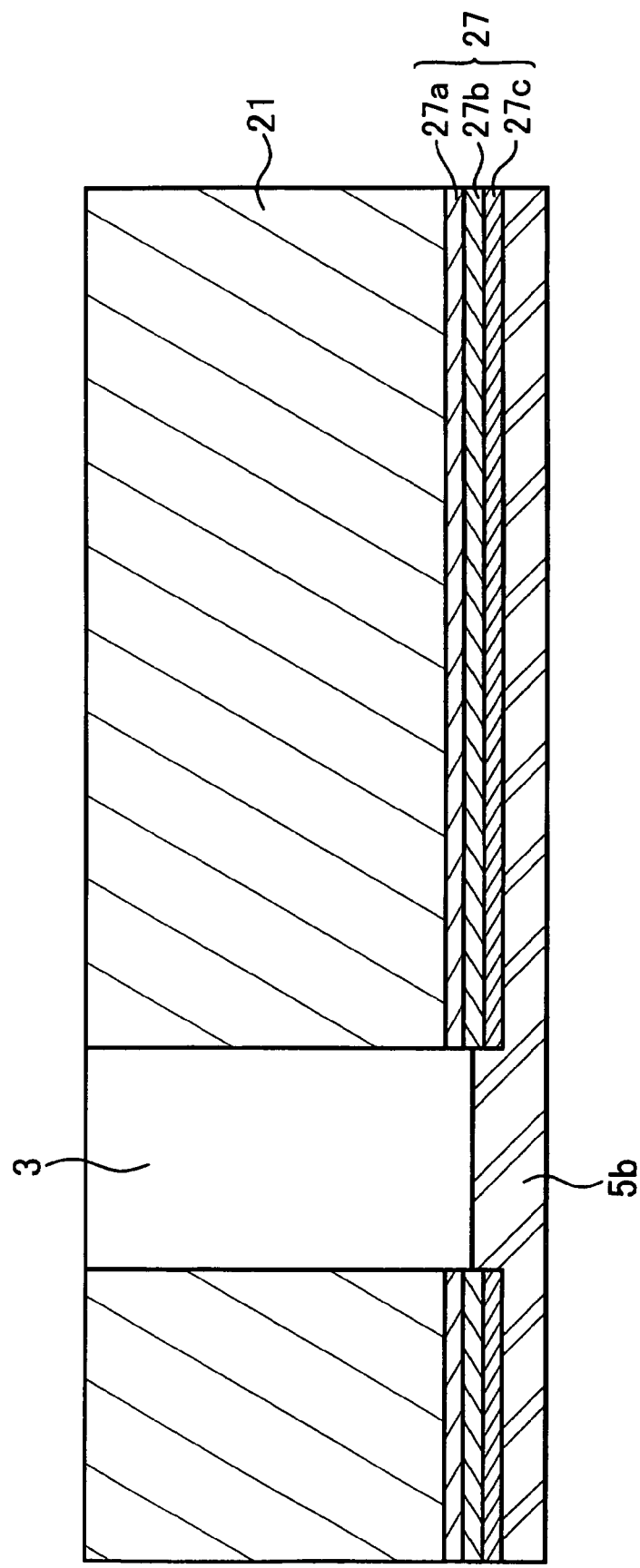
FIG. 15 is a first sectional view of an electrolytic plating step according to a second embodiment.
Figure 16:
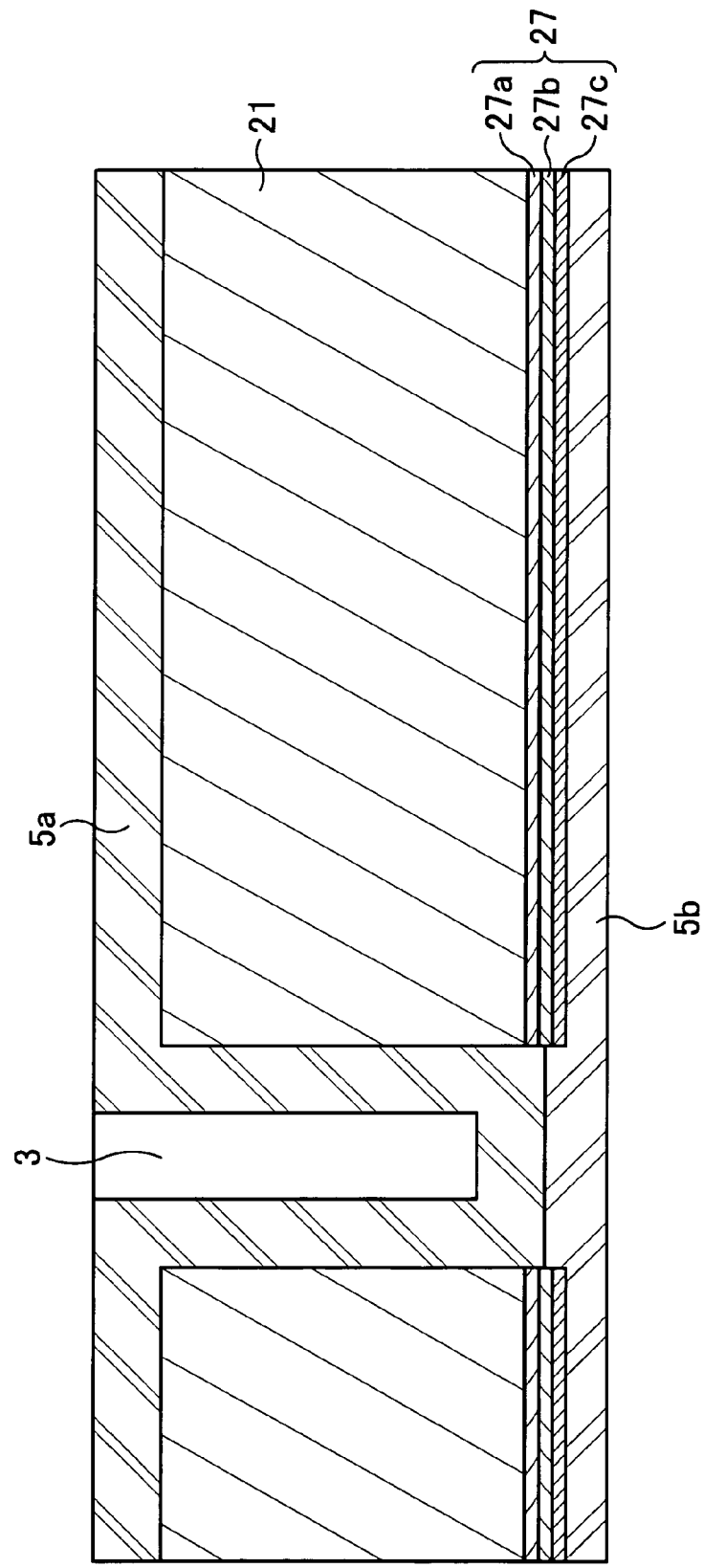
FIG. 16 is a sectional view of an electroless plating step according to a second embodiment.
Figure 17:
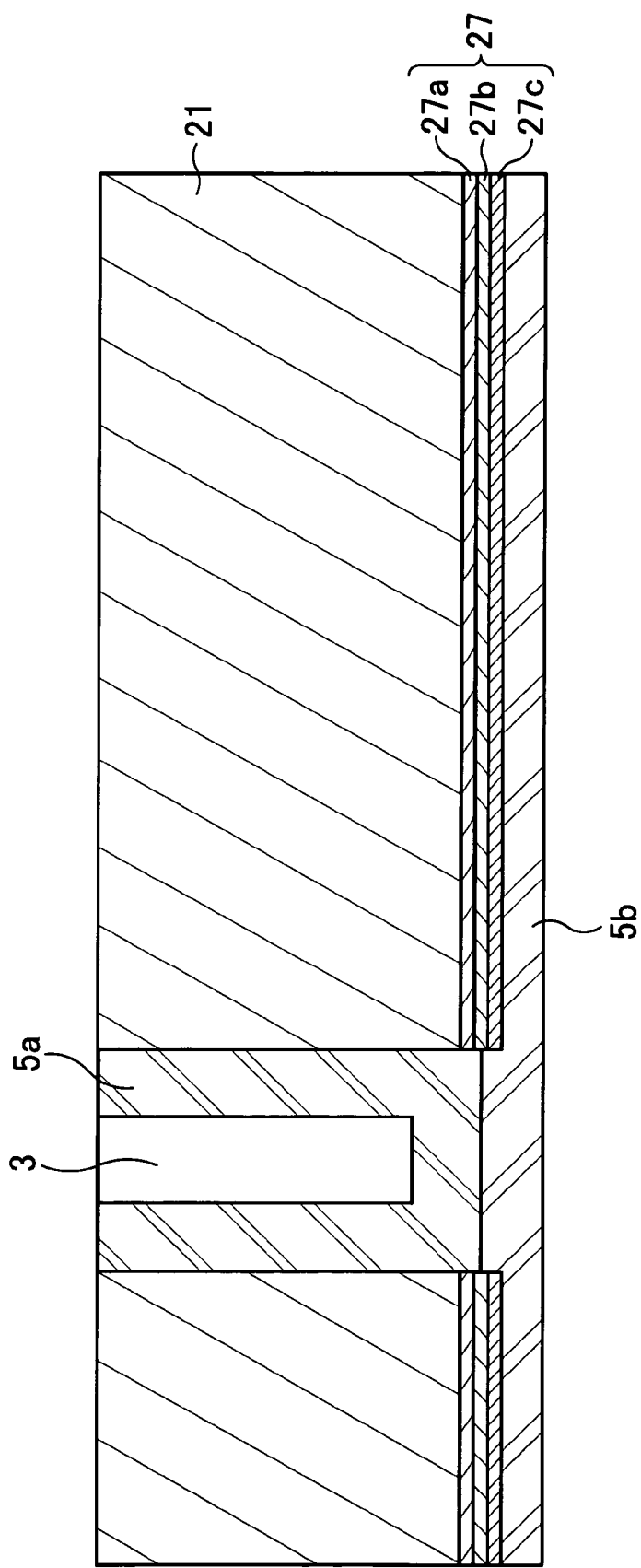
FIG. 17 is a first sectional view of a metal layer removal step according to a second embodiment.
Figure 18:
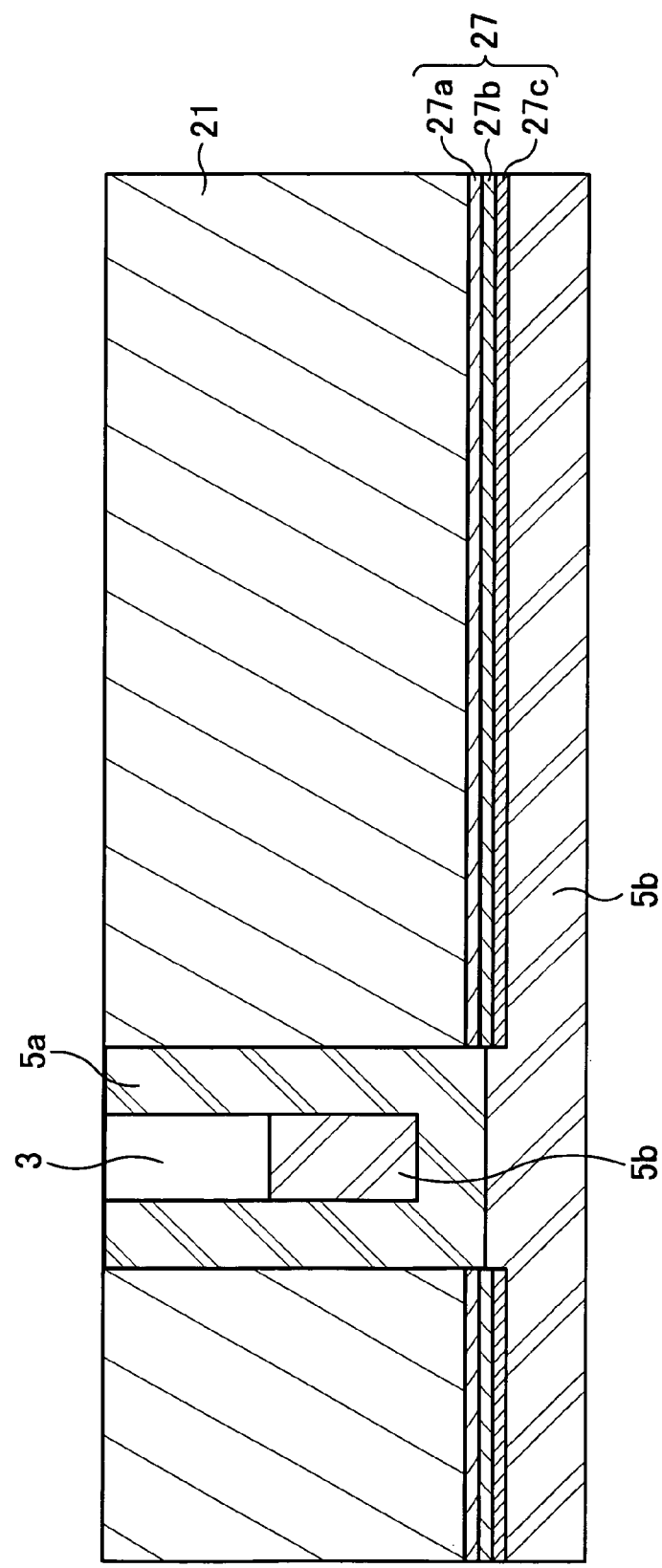
FIG. 18 is a second sectional view of an electrolytic plating step according to a second embodiment.
Figure 19:
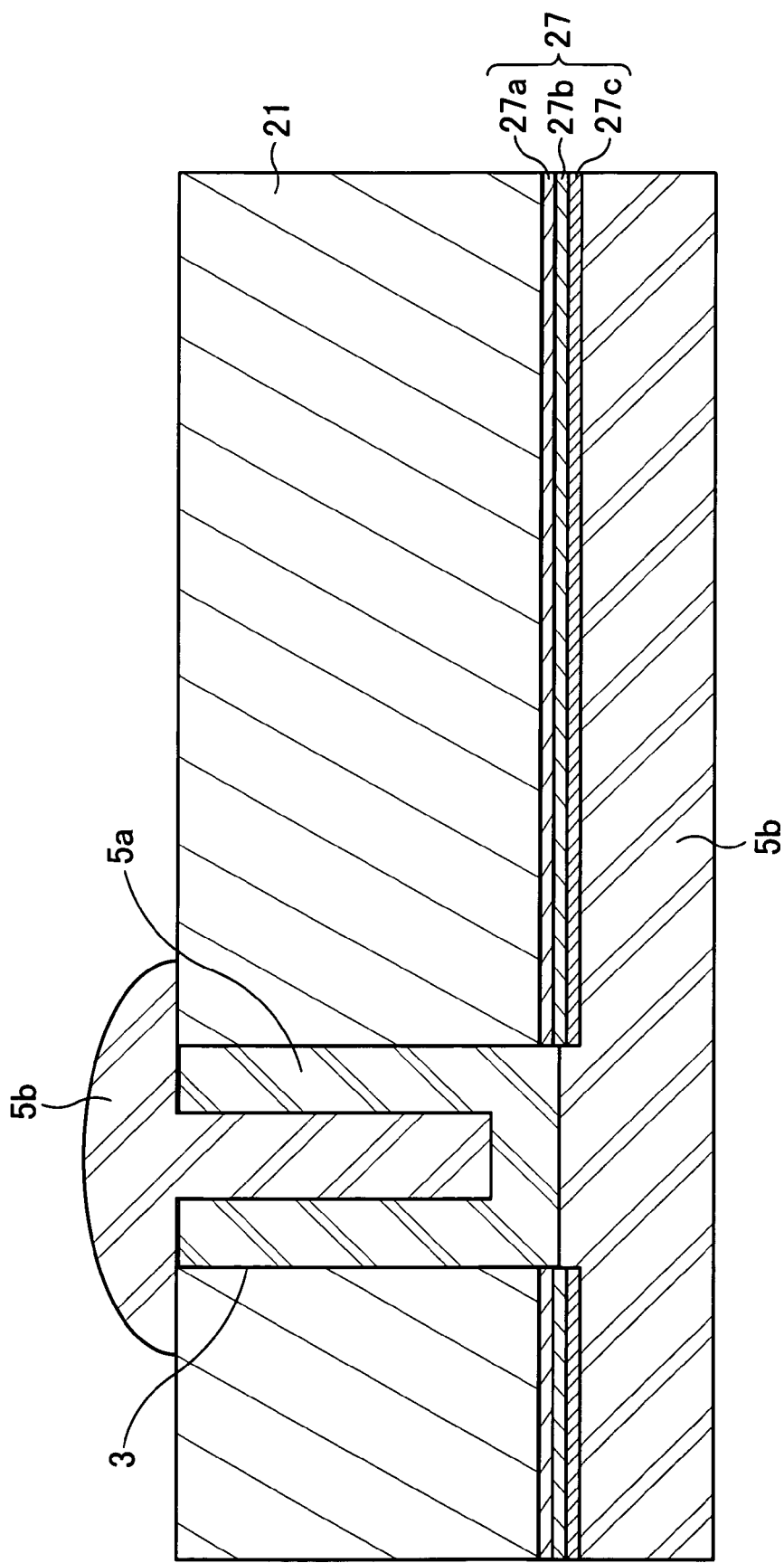
FIG. 19 is a third sectional view of an electrolytic plating step according to a second embodiment.
Figure 20:
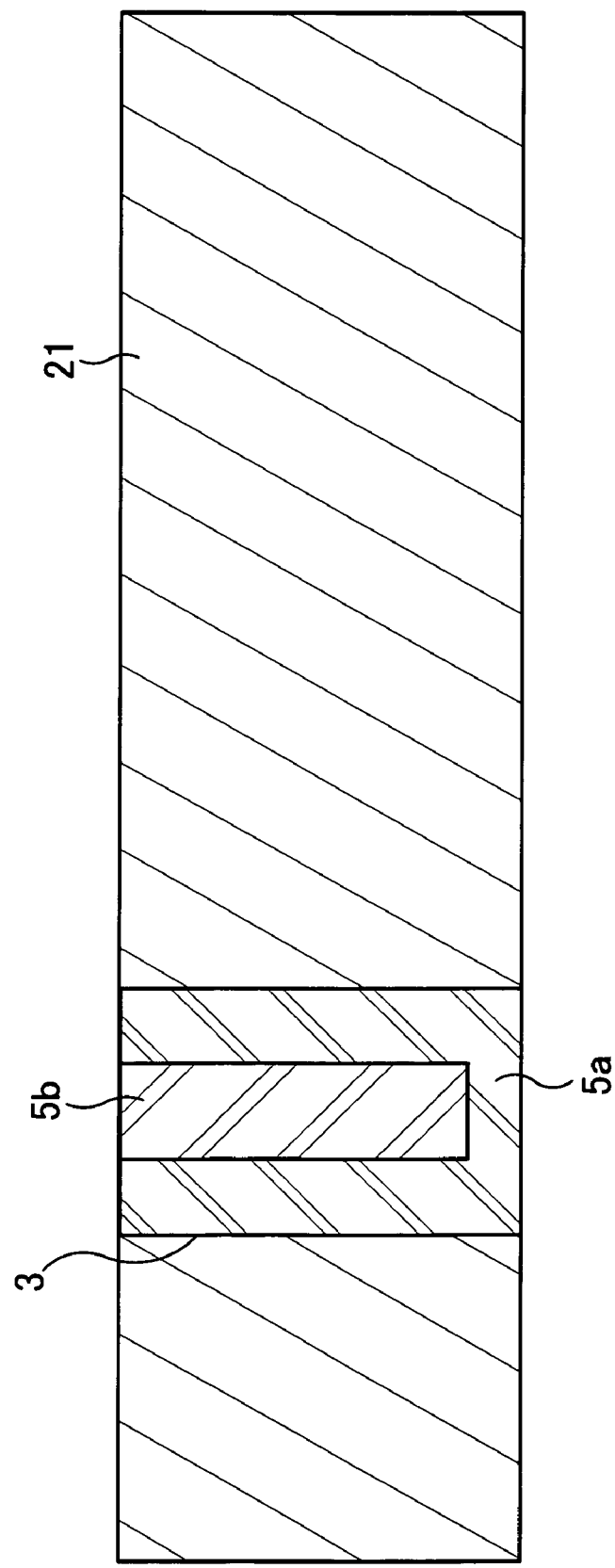
FIG. 20 is a second sectional view of a metal layer removal step according to a second embodiment.

FIG. 14 is a sectional view of the electrode layer formation step according to the second embodiment. FIG. 15 is a first sectional view of the electrolytic plating step according to the second embodiment. FIG. 16 is a sectional view of the electroless plating step according to the second embodiment. FIG. 17 is a first sectional view of the metal layer removal step according to the second embodiment. FIG. 18 is a second sectional view of the electrolytic plating step according to the second embodiment. FIG. 19 is a third sectional view of the electrolytic plating step according to the second embodiment. FIG. 20 is a second sectional view of the metal layer removal step according to the second embodiment.

After passing through the glass substrate reforming step, an electrode layer 27 is first formed on one surface of the crystallized glass substrate 21 as shown in FIG. 14. Herein, a surface having formed thereon the electrode layer 27 is designated as a substrate rear surface and a surface opposite to the substrate rear surface is designated as a substrate front surface. A material selection and forming method of the electrode layer 27 are the same as those of the preliminary adhesion-reinforcing layer 17 in the first embodiment. The preliminary adhesion-reinforcing layer 17 is formed for strengthening adhesion between the electroless plating copper layer 5a and the ion blocking layer 4 or between the layer 5a and the photosensitive glass substrate 2 or the crystallized substrate 2. On the other hand, the electrode layer 27 acts as an electrode in forming the electrolytic plating copper layer 5b.

The electrode layer 27 can be formed to have a three-layer structure composed of a sputtering chromium layer 27a, a sputtering chromium-copper layer 27b and a sputtering copper layer 27c, for example, as shown in FIG. 14. In this case, the sputtering chromium layer 27a preferably has a thickness of about 0.04 to 0.1 μm, the sputtering chromium-copper layer 27b as the intermediate layer preferably has a thickness of about 0.04 to 0.1 μm, and the sputtering copper layer 27c preferably has a thickness of about 0.5 to 1.5 μm.

After the formation of the electrode layer 27, the opening part of the through-hole 3 in the rear surface side of the crystallized glass substrate 21 is sealed with the electrolytic plating copper layer 5b using opening part sealing plating as shown in FIG. 15. Current density conditions in forming the electrolytic plating copper layer 5b are the same as the opening part sealing plating conditions in the first embodiment, and the formation of the layer 5b is performed under the condition that a current density is about 1 to 5 A/dm$^2$. Further, during the electrolytic plating, current is applied in a state where the substrate rear surface side is faced to the anode in a plating bath.

After the opening part sealing plating, the electroless plating copper layer 5a is formed by the electroless plating method. As shown in FIG. 16, the electroless plating copper layer 5a is deposited not only on the side wall part of the through-hole 3 but also on the front surface of the crystallized glass substrate 21.

After forming the electroless plating copper layer 5a, the layer 5a deposited on the front surface side of the crystallized glass substrate 21 is removed using the lapping method as shown in FIG. 17. This removal step is performed in order that during the filling plating subsequently performed, the electrolytic plating copper layer 5b may be prevented from being deposited on the front surface side of the crystallized glass substrate 21.

Next, as shown in FIGS. 18 and 19, the electrolytic plating copper layer 5b is further formed by the filling plating, whereby the through-hole 3 is filled with the layer 5b together with the layer 5a and layer 5b previously formed within the through-hole 3. The current density conditions at this time are the same as those in the first embodiment, and the formation of the layer 5b is performed under the condition that a current density is as relatively low as about 0.2 to 0.8 A/dm$^2$. Further, during the electrolytic plating, current is applied in a state where the substrate front surface side is faced to the anode in a plating bath. At a stage where the filling plating is completed, the layer 5b may be projected and formed also on the substrate front surface side as shown in FIG. 19. The projecting part is removed using the lapping method.

Next, copper in the electrolytic plating copper layer 5b, the sputtering copper layer 27c and the sputtering chromium-copper layer 27b formed on the substrate rear surface is removed by etching using chemicals mainly composed of ferric chloride. Thereafter, chromium in the sputtering chromium-copper layer 27b and the sputtering chromium layer 27a is removed by etching using chemicals mainly composed of potassium ferricyanide. By thus removing the respective metal layers, there can be obtained a state where the front and rear surfaces of the crystallized glass substrate 21 are exposed as well as the through-hole 3 is filled with the electroless plating copper layer 5a and the electrolytic plating copper layer 5b as shown in FIG. 20.

Thereafter, by passing through the adhesion-reinforcing layer formation step and the wiring formation step, a double-sided wiring glass substrate having the same constitution as in FIG. 1 can be obtained.

In the above-described first and second embodiments, there is described a case where both of a metal formed by the electroless plating method and a metal formed by the electrolytic plating method are copper. Further, the type of metals may be allowed to differ such that a metal formed by the electrolytic plating method is copper and a metal formed by the electroless plating method is nickel (Ni) or chromium.

Preferred embodiments of the present invention will be described in detail below with reference to the examples. In any example shown below, PEG3 (trade name) manufactured by HOYA CORPORATION is used for the photosensitive glass substrate as the core substrate of the double-sided wiring glass substrate. The PEG3 has the composition of $SiO_2$: 78.0% by weight, $Li_2O$: 10.0% by weight, $Al_2O_3$: 6.0% by weight, $K_2O$: 4.0% by weight, $Na_2O$: 1.0% by weight, ZnO: 1.0% by weight, Au: 0.003% by weight, Ag: 0.08% by weight and $CeO_2$: 0.08% by weight.

EXAMPLE 1

A manufacturing method according to the first embodiment will be described in detail. The manufacturing process is composed of the through-hole formation step, the ion blocking layer formation step, the through-hole filling step, the adhesion-reinforcing layer formation step and the wiring formation step, as described above. These steps will be sequentially described in detail below.

(Through-Hole Formation Step)

With a photomask brought into close contact with the photosensitive glass substrate 2, ultraviolet rays are emitted onto a through-hole formation part through the photomask, thereby forming a latent image corresponding to the exposed part. The photomask used comprises a silica glass substrate having formed on the surface thereof a desired through-hole array pattern using a chromium/chromium oxide layer. A light source used is a deep UV lamp and irradiation energy is set to 800 mJ/cm$^2$. Thereafter, the photosensitive glass substrate 2 is subjected to thermal treatment at a temperature of about 400° C. to crystallize a through-hole formation part, thereby forming the exposed crystallized part 3a (FIG. 2). After forming the exposed crystallized part 3a, dilute hydrofluoric acid (about 10% solution) is sprayed on the front and rear surfaces of the photosensitive glass substrate 2 to remove by resolution the exposed crystallized part 3a from the substrate 2. Thus, the through-hole 3 with a diameter of about 50 μm is formed (FIG. 3).

(Ion Blocking Layer Formation Step)

The photosensitive glass substrate 2 having formed therein the through-hole 3 is immersed in an aqueous solution containing about 20% by volume of sulfuric acid and is applied with a plus voltage of about 20 V for about 10 minutes. Thus, the substrate 2 is subjected to dealkalization treatment. The negative electrode used at this time is made of stainless steel. After the dealkalization treatment, using a normal RF sputtering system, an $Si_3N_4$ film having a film thickness of about 0.05 μm is formed on each of the front and rear surfaces of the photosensitive glass substrate 2 to thereby form the sputtering silicon nitride layer 4a and then, an $SiO_2$ film having a film thickness of about 0.05 μm is formed on the layer 4a to thereby form the sputtering silicon oxide layer 4b (FIG. 4). Thus, the ion blocking layer 4 is formed.

(Through-Hole Filling Step)

Using a normal DC sputtering system, a chromium film having a film thickness of about 0.05 μm is formed on the sputtering silicon oxide layer 4b to thereby form the sputtering chromium layer 17a, a chromium copper alloy film (chromium: about 4%, copper: about 96%) having a film thickness of about 0.05 μm is formed on the layer 17a to thereby form the sputtering chromium-copper layer 17b, and a copper film having a film thickness of about 1.5 μm is formed on the layer 17b to thereby form the sputtering copper layer 17c. Thus, the preliminary adhesion-reinforcing layer 17 is formed. These metal films are formed continuously in an air-shutoff environment (FIG. 5).

Thereafter, a copper film having a film thickness of about 0.3 μm is formed using an electroless plating method to thereby form the electroless plating copper layer 5a (FIG. 6). The electroless plating process is performed in the order corresponding to pretreatment, soft etching, predipping, catalysis imparting, catalysis activation and electroless plating.

The pretreatment is performed for cleaning the photosensitive glass substrate 2 after the formation of the preliminary adhesion-reinforcing layer 17. Melplate PC-321 which is a commercially available cleaning liquid manufactured by Meltex, Inc. is used.

The soft etching is performed for removing an oxide film formed on a surface of the preliminary adhesion-reinforcing layer 17. Enplate E-462 which is a commercially available soft etching solution manufactured by Meltex, Inc. is used.

In order to protect a catalytic bath of the following process, the predipping is performed for immersing in a predip solution the photosensitive glass substrate 2 with the preliminary adhesion-reinforcing layer 17. Enplate PC-236 which is a commercially available predip solution manufactured by Meltex, Inc. is used.

In order to deposit the electroless plating copper, the catalysis imparting is performed for allowing a catalyst to be adsorbed to the photosensitive glass substrate 2 with the preliminary adhesion-reinforcing layer 17. A commercially available Enplate Activator-444 manufactured by Meltex, Inc. is used.

The catalysis activation is performed for activating the adsorbed catalyst. A commercially available Enplate PA-360 manufactured by Meltex, Inc. is used.

The electroless plating is performed for forming the electroless plating copper layer 5a. A commercially available Melplate Cu-390 manufactured by Meltex, Inc is used as a plating solution.

After the formation of the electroless plating copper layer 5a, the adhesive tape 10 is attached to the substrate front surface to seal the opening part of the through-hole 3 in the substrate front surface side (FIG. 7). Thereafter, by the opening part sealing plating, a copper film is formed to seal with the electrolytic plating copper layer 5b the opening part of the through-hole 3 in the substrate rear surface side to which no adhesive tape 10 is attached (FIG. 8). An electrolytic plating solution used is LEVCO 300 (trade name) manufactured by C. Uyemura & Co., Ltd., which is a commercially available copper sulfate plating solution. Further, the current density in the electrolytic plating is set to 3 A/dm$^2$, and current is applied in a state where the substrate rear surface side is faced to the anode in a plating bath. Under these conditions, the electrolytic plating copper layer 5b having a film thickness of about 30 μm is formed on a flat part of the substrate rear surface.

After the opening part sealing plating, the adhesive tape 10 is detached. Further, the electroless plating copper layer 5a and sputtering copper layer 17c on the substrate front surface having attached thereon the adhesive tape 10 are first removed mechanically using the lapping method. Thereafter, the sputtering chromium-copper layer 17b and the sputtering chromium layer 17a are removed by etching using chemicals mainly composed of potassium ferricyanide, whereby the ion blocking layer 4 is exposed on the substrate front surface.

Thereafter, the electrolytic plating copper layer 5b is further formed by the filling plating, whereby the through-hole 3 is filled with the layer 5b together with the layer 5b previously formed within the through-hole 3 (FIGS. 9 and 10). The plating solution used at this time is the same as that used in the opening part sealing plating. A current density is set to 0.5 A/dm$^2$, which is a low current value as compared with the current density in the through-hole sealing plating. Further, during the filling plating, current is applied in a state where the substrate front surface side is faced to the anode in a plating bath.

After the completion of the filling plating, copper in the electrolytic plating copper layer 5b, the electroless plating copper layer 5a, the sputtering copper layer 17c and the sputtering chromium-copper layer 17b formed on the substrate rear surface is removed by etching using chemicals mainly composed of ferric chloride. Thereafter, chromium in the sputtering chromium-copper layer 17b and the sputtering chromium layer 17a is removed by etching using chemicals mainly composed of potassium ferricyanide. Thus, the ion blocking layer 4 is exposed on the substrate front and rear surfaces as well as the through-hole 3 is filled with the copper film layer 5 of metallic copper, which is composed of the electroless plating copper layer 5a and the electrolytic plating copper layer 5b (FIG. 11).

(Adhesion-Reinforcing Layer Formation Step)

Using a normal sputtering system, a chromium film having a film thickness of about 0.05 μm is formed on the exposed sputtering silicon oxide layer 4b to thereby form the sputtering chromium layer 7a, a chromium copper alloy film (chromium: about 4%, copper: about 96%) having a film thickness of about 0.05 μm is formed on the layer 7a to thereby form the sputtering chromium-copper layer 7b, and a copper film having a film thickness of about 1.5 μm is formed on the layer 7b to thereby form the sputtering copper layer 7c. Thus, the adhesion-reinforcing layer 7 is formed. These metal films are formed continuously in an air-shutoff environment (FIG. 12).

(Wiring Formation Step)

A copper film having a film thickness of about 5 μm is formed using the electrolytic plating method to thereby form the copper film layer 6 serving as wirings (FIG. 13). A plating solution used is a commercially available copper sulfate plating solution (Copper Gleam ST-901 manufactured by Meltex Inc.). The current density condition is set to 3 A/dm$^2$.

To a surface of the copper film layer 6, a positive liquid resist (MICROPOSIT SJR5440 manufactured by SHIPLEY COMPANY) is applied to a thickness of about 10 μm using a spinner. Then, using a photomask having drawn thereon a desired wiring pattern, exposure is carried out using a mask aligner. The amount of exposure at this time is set to about 1000 mJ/cm$^2$. Subsequently, using a developing solution (DEVELOPER 2500 manufactured by SHIPLEY COMPANY), development is performed by a dipping method at room temperature for about 1 minute to form a resist pattern on the copper film layer 6. Thereafter, the layer 6 having formed thereon the resist pattern is sprayed with a solution of 40-Baume ferric chloride to remove, by etching, copper in the copper film layer 6, the sputtering copper layer 7c and the sputtering chromium-copper layer 7b, and then the resist is removed using acetone. Subsequently, using the etched copper film layer 6 as a metal resist, etching is performed to remove chromium in the sputtering chromium-copper layer 7b and the sputtering chromium layer 7a using chemicals mainly composed of potassium ferricyanide. Thus, a wiring pattern with a line width of about 20 μm, a line spacing of about 20 μm and a through-hole land width of about 120 μm is formed.

Using the above-described method, the double-sided wiring glass substrate 1 having the through-hole 3 filled with metallic copper formed by simultaneously using the electroless plating method and the electrolytic plating method is obtained (FIG. 1).

EXAMPLE 2

This example is different from Example 1 only in the conditions of the electroless plating method in the through-hole filling step, and in the metal type formed by the electroless plating method. The other steps of this example are the same as those of Example 1.

In this example, a nickel film having a film thickness of about 0.3 μm is formed using the electroless plating method. The electroless plating process thereof is fundamentally the same as the process which is performed in the order corresponding to pretreatment, soft etching, predipping, catalysis imparting, catalysis activation and electroless plating described in Example 1. However, the process of this example is different from that of Example 1 in the final electroless plating part. Herein, Melplate NI-865 manufactured by Meltex, Inc. is used as a plating solution for electroless plating of a nickel film.

EXAMPLE 3

This example is a concrete example of the manufacturing method according to the second embodiment. As described above, the manufacturing process thereof includes the through-hole formation step, glass substrate reforming step, the through-hole filling step, the adhesion-reinforcing layer formation step and the wiring formation step. Among these steps, the through-hole formation step, the adhesion-reinforcing layer formation step and the wiring formation step are the same as those of Example 1. Therefore, the glass substrate reforming step and the through-hole filling step will be described in detail below.

(Glass Substrate Reforming Step)

The whole photosensitive glass substrate 2 having formed therein the through-hole 3 through the through-hole formation step is irradiated with ultraviolet rays in an exposure amount of about 700 mJ/cm$^2$, and then subjected to thermal treatment at a temperature of about 850° C. for about two hours. Thus, the whole photosensitive glass substrate 2 is crystallized to form the crystallized glass substrate 21.

(Through-Hole Filling Step)

In the through-hole filling step, using a normal sputtering system, the electrode layer 27 is formed on the rear surface side of the crystallized glass substrate 21 as follows. First, a chromium film having a film thickness of about 0.05 μm is formed to thereby form the sputtering chromium layer 27a. Subsequently, a chromium copper alloy film having a film thickness of about 0.05 μm is formed on the layer 27a to thereby form the sputtering chromium-copper layer 27b. Finally, a copper film having a film thickness of about 1.5 μm is formed on the layer 27b to thereby form the sputtering copper layer 27c (FIG. 14). These metal films are formed continuously in an air-shutoff environment.

After the formation of the electrode layer 27, the electrolytic plating copper layer 5b is formed by the opening part sealing plating to seal the opening part of the through-hole 3 in the electrode layer 27 formation surface side of the crystallized glass substrate 21 (FIG. 15). The electrolytic plating conditions at this time are the same as the opening part sealing plating conditions shown in Example 1.

After the opening part sealing plating, the electroless plating copper layer 5a is formed within the through-hole 3 using the electroless plating method. The electroless plating conditions are the same as those of Example 1. The electroless plating copper layer 5a within the through-hole 3 has a film thickness of about 3 μm (FIG. 16). Thereafter, using the lapping method, there is removed the electroless plating copper layer 5a attached to a front surface side of the crystallized glass substrate 21, that is, a surface side on which no electrode layer 27 is formed (FIG. 17).

After removing the electroless plating copper layer 5a attached to the front surface side of the crystallized glass substrate 21, the electrolytic plating copper layer 5b is formed within the through-hole 3 using the filling plating, thereby filling the through-hole 3 with the layer 5b (FIGS. 18 and 19). The filling plating conditions at this time are the same as those of Example 1. The electrolytic plating copper layer 5b (FIG. 19) which projects on the substrate front surface side is removed using the lapping method.

Next, copper in the electrolytic plating copper layer 5b, the sputtering copper layer 27c and the sputtering chromium-copper layer 27b formed on the substrate rear surface is removed by etching using chemicals mainly composed of ferric chloride. Thereafter, chromium in the sputtering chromium-copper layer 17b and the sputtering chromium layer 17a is removed by etching using chemicals mainly composed of potassium ferricyanide. After thus removing the respective metal layers, the rear surface of the crystallized glass substrate 21 having formed thereon the electrode layer 27 is lapped, whereby the electroless plating copper layer 5a and the electrolytic plating copper layer 5b are exposed on the front and rear surfaces of the crystallized glass substrate 21 (FIG. 20).

EXAMPLE 4

This example is different from Example 3 only in the conditions of the electroless plating method in the through-hole filling step, and in the metal type formed by the electroless plating method. The other steps of this example are the same as those of Example 3.

In this example, a nickel film having a film thickness of about 0.3 μm is formed using the electroless plating method. The electroless plating process thereof is fundamentally the same as the process which is performed in the order corresponding to pretreatment, soft etching, predipping, catalysis imparting, catalysis activation and electroless plating described in Example 1. However, the process of this example is different from that of Example 1 in the final electroless plating part. Herein, Melplate NI-865 manufactured by Meltex, Inc. is used as a plating solution for electroless plating of a nickel film.

In the above-described example, the same plating solution is used in the opening part sealing plating and the subsequent filling plating. However, for the respective plating processes, there can be used more suitable plating solutions, for example, plating solutions each having different plating metal ion concentrations in the plating solution.

As described above, in the double-sided wiring glass substrate of the present invention, the through-hole for electrically connecting the substrate front and rear surfaces is filled with a metal, so that the substrate front and rear surfaces can be surely made electrically connective. Further, in the double-sided wiring glass substrate of the present invention, no conventional resin is used as filling materials of the through-hole, so that high thermal resistance as the whole substrate can be realized. Further, the plating method is used in filling the through-hole with a metal, so that the through-hole can be surely filled with a metal. Thus, according to the double-sided wiring glass substrate of the present invention, high-density mounting with high connection reliability of electronic parts can be realized.

In the above description, the case of mainly using copper as a metal for filling the through-hole of the double-sided wiring glass substrate is described by way of example. In addition to copper, any metal having thermal resistance not less than a temperature for bonding surface-mounted electronic parts, such as, nickel, silver, gold, platinum (Pt), palladium (Pd), chromium and aluminum may be used without any trouble. Further, a plurality of these metals may be selected for use. Among these metals, copper is particularly suitable as a metal for filling the through-hole in terms of a high melting point, low resistance and price. Further, a material, layer structure and forming method of the electrode layer and the adhesion-reinforcing layer can be appropriately changed depending on a type of metals for filling the through-hole.

The manufacturing method of the double-sided wiring glass substrate of the present invention, in which the through-hole is filled with metals, can be applied also to a multilayer wiring substrate. Further, the manufacturing method can be applied also to a double-sided wiring substrate or multilayer wiring substrate using as a core substrate a ceramic substrate or a glass epoxy substrate.

According to the method for manufacturing a double-sided wiring glass substrate of the present invention, a through-hole is filled with a metal, so that front and rear surfaces of the double-sided wiring glass substrate can be surely made electrically connective as well as thermal resistance thereof can be improved. As a result, there can be realized the double-sided wiring glass substrate allowing high-density mounting with high connection reliability of electronic parts.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for manufacturing a double-sided wiring glass substrate having electric wirings formed on the front and rear surfaces of a glass substrate, and a through-hole filled with a metal and penetrating the glass substrate, the respective electric wirings formed on the front and rear surfaces of the glass substrate being made electrically connective through the metal filling the through-hole, the method comprising:

forming the through-hole in the glass substrate and forming a preliminary adhesion-reinforcing layer on the front and rear surfaces of the glass substrate, depositing, by an electroless plating method, a first metal on a sidewall part of the through-hole while allowing a void part penetrating the glass substrate to remain in a central part of the through-hole and on the preliminary adhesion-reinforcing layers, sealing, by an electrolytic plating method, at a first current density, with a second metal an opening part of the void part in the rear surface of the glass substrate, removing the preliminary adhesion-reinforcing layer and the first metal from the front surface of the glass substrate, depositing, by said electrolytic plating method, at a second current density which is lower than the first current density, the second metal in the void part inside from the one sealed opening part to the other opening part to thereby fill the through-hole inside with the second metal, and removing the preliminary adhesion-reinforcing layer and the first metal and the second metal from the rear surface of the glass substrate.

2. The method according to claim 1, wherein the metal filling the through-hole is composed of any one or more of copper, nickel, gold, silver, platinum, palladium, chromium and aluminum.

3. The method according to claim 1,
wherein a photosensitive glass substrate is used as the glass substrate, and the first step comprises:
a step of exposing the glass substrate through a photomask to form a latent image on a part of the glass substrate in which the through-hole is formed;
a step of subjecting the glass substrate to thermal treatment to crystallize the exposed part; and
a step of removing by dissolving the crystallized part to form the through-hole in the glass substrate.

4. The method according to claim 1, wherein the metal deposited by the electroless plating method and the metal deposited by the electrolytic plating method are different in a type of metals.

5. The method according to claim 1, wherein the metal deposited by the electroless plating method and the metal deposited by the electrolytic plating method are different in a type of metals.

6. The method according to claim 1, wherein an adhesive tape is deposited onto the metal plated substrate.

* * * * *

Disclaimer

7,993,509—Takashi Fushie, Tokyo (JP); Norimichi Annaka, Yamanashi (JP); Takeshi Kagatsume, Tokyo (JP). MANUFACTURING METHOD OF DOUBLE-SIDED WIRING GLASS SUBSTRATE. Patent dated August 9, 2011. Disclaimer filed April 1, 2011, by the assignee, Hoya Corporation.

Hereby enters the term of this patent not to exceed beyond the expiration date of Ser. No. 11/369,002 filed March 7, 2006.

*(Official Gazette September 20, 2011)*